United States Patent
Nakatogawa

(10) Patent No.: US 7,703,609 B2
(45) Date of Patent: Apr. 27, 2010

(54) WAFER CARRIER POSITIONING STRUCTURE

(75) Inventor: Takuji Nakatogawa, Ichihara (JP)

(73) Assignee: Vantec Co., Ltd., Tokyo (JP)

( * ) Notice: Subject to any disclaimer, the term of this patent is extended or adjusted under 35 U.S.C. 154(b) by 156 days.

(21) Appl. No.: 11/812,614

(22) Filed: Jun. 20, 2007

(65) Prior Publication Data

US 2008/0041761 A1  Feb. 21, 2008

(30) Foreign Application Priority Data

Jun. 28, 2006 (JP) .............................. 2006-178395

(51) Int. Cl.
    B65D 85/86 (2006.01)
(52) U.S. Cl. ................... 206/711; 206/454; 206/710
(58) Field of Classification Search ........... 206/10–712, 206/722, 454, 832, 833
    See application file for complete search history.

(56) References Cited

U.S. PATENT DOCUMENTS

| 5,711,427 | A | * | 1/1998 | Nyseth | 206/710 |
|---|---|---|---|---|---|
| 5,944,194 | A | * | 8/1999 | Gregerson et al. | 206/711 |
| 6,105,782 | A | * | 8/2000 | Fujimori et al. | 206/710 |
| 6,216,874 | B1 | | 4/2001 | Bores et al. | |
| 6,382,419 | B1 | * | 5/2002 | Fujimori et al. | 206/454 |
| 6,446,806 | B1 | * | 9/2002 | Ohori et al. | 206/454 |
| 6,520,338 | B2 | * | 2/2003 | Bores et al. | 206/711 |
| RE38,221 | E | * | 8/2003 | Gregerson et al. | 206/711 |
| 6,851,170 | B2 | * | 2/2005 | Lappen et al. | 29/464 |
| 6,905,026 | B2 | * | 6/2005 | Chih-Kang | 206/710 |
| 2003/0029765 | A1 | * | 2/2003 | Bhatt et al. | 206/454 |
| 2005/0077204 | A1 | * | 4/2005 | Sumi et al. | 206/710 |
| 2006/0207916 | A1 | * | 9/2006 | Mimura et al. | 206/710 |
| 2007/0295638 | A1 | * | 12/2007 | Nakatogawa | 206/711 |

FOREIGN PATENT DOCUMENTS

| JP | 11-168136 | 6/1999 |
|---|---|---|
| JP | 2002-353299 | 12/2002 |
| JP | 2003-524550 | 8/2003 |
| JP | 2005-162263 | 6/2005 |
| WO | WO 2004079818 A1 * | 9/2004 |

* cited by examiner

*Primary Examiner*—Ehud Gartenberg
*Assistant Examiner*—Andrew Perreault
(74) *Attorney, Agent, or Firm*—Wenderoth, Lind & Ponack, L.L.P.

(57) ABSTRACT

A wafer carrier positioning structure including a carrier body having a bottom face and a frame body provided in a peripheral part of the bottom face to project downwardly, for housing a wafer therein so that the wafer is parallel to the bottom face. Further, the wafer positioning structure includes a guide member detachably attached to the bottom face of the carrier body, a guide groove provided in the guide member, for engaging with a positioning pin projecting from a mounting face upon mounting the carrier body to the mounting face, so as to guide the carrier body to a regular mounting position, and a locking portion provided in the guide member, locking to an inside face of the frame body while elastically having contact with the inside face.

3 Claims, 20 Drawing Sheets

WAFER CARRIER POSITIONING STRUCTURE

CROSS-REFERENCE TO THE RELATED APPLICATION

The present application is based on and claims priority from Japanese Patent Application No. 2006-178395 filed on Jun. 28, 2006, the disclosure of which is hereby incorporated by reference herein in its entirety.

BACKGROUND

The present invention relates to a wafer carrier positioning structure having a precise positioning accuracy.

A wafer carrier positioning structure as illustrated in FIGS. 22, 23 is known (for example, refer to paragraph 0028-0045 and FIGS. 2, 4, JP H11-168136A, and paragraph 0017-0058 and FIG. 1, JP 2005-162263A).

Such a wafer carrier positioning structure includes a carrier body 1 and a lid. The carrier body 1 substantially having a box shape includes at one side thereof an opening 1a through which a semiconductor wafer W as a wafer can be placed in and taken out. The lid opens and closes the opening 1a of the carrier body 1.

The carrier body 1 includes inside thereof a plurality of aligned ribs 1c and 1a bottom face 1b. The bottom face 1b includes three pairs of positioning ribs each having a pair of positioning ribs 3, 3 disposed to be parallel to each other in the radial direction of the semiconductor wafer W. The three pairs of positioning ribs are disposed in the right and left portions of the bottom face 1b on the opening 1a side and the center portion of the peripheral portion of bottom face 1b on the side opposite the opening 1a, so as to be located substantially in the vicinity of apexes of a triangle shape in plan view.

The lower end of each of the positioning ribs 3, 3 includes an inclined plane 3a.

The inclined planes 3a, 3a are formed to oppose each other. In the case of mounting the wafer carrier onto an automatic wafer transfer device 2, each of kinematic couplings 2a as a positioning pin projecting from a mounting face 2b of the device 2 has contact with each pair of the inclined faces 3a, 3a, so as to perform the positioning of the wafer carrier.

The bottom face 1b of the carrier body 1 includes a bottom plate 4 as a guide member. The bottom plate 4 is detachably attached onto the bottom face 1b of the carrier body 1 by externally fitting each of guide grooves 4a provided on the bottom plate 4 to each pair of positioning ribs 3, 3.

The lower of each of the guide grooves 4a includes inclined faces 4b, 4b each having an inclined angle which follows the inclined angle of the inclined face 3a.

Next, the operations of the above wafer carrier positioning structure will be explained.

In this wafer carrier positioning structure, when attaching the bottom plate 4 onto the bottom face 1b of the carrier body 1, each of the guide grooves 4a of the bottom plate 4 is externally fitted to each pair of the positioning ribs 3, 3 projecting from the bottom face 1b of the carrier body 1, As described above, the inclined planes 4b, 4b formed in the lower peripheral part of the guide groove 4a of the bottom plate 4 have inclined angles which follow the inclined angles of the inclined faces 3a, 3a of the positioning ribs 3, 3.

Accordingly, as illustrated in FIG. 23, when mounting the carrier body 1 onto the device 2, the kinematic couplings 2a are smoothly guided by the inclined faces 4b, 4b; thereby, the kinematic couplings 2a can be positioned below the inclined faces 3a, 3a.

With the carrier body 1 is located in a regular mounting position of the device 2, the semiconductor wafers W can be precisely placed in and taken out via the opening 1a by means of a robot of an automatic device, without damaging the wafer.

A wafer carrier positioning structure as shown in FIG. 24 is also known (for example, refer to paragraph 0008-0014 and FIGS. 1, 3, JP 2003-524550A).

In this wafer carrier positioning structure, a bottom plate 5 includes a plurality of boss holes 5a. Each of the boss holes 5a is externally fitted to each of boss portions projecting from the bottom face 1b of the carrier body 1.

The bottom plate 5 includes a retaining feature 5b which engages with a clamp portion of the device 2.

The retaining feature 5b is used for mounting the carrier body 1 onto the device 2 and also demounting the carrier body 1 from the device 2. For example, in the case of mounting the carrier body 1 onto the device 2, the clamp portion of the device 2 engages with the retaining feature 5b.

In addition, a wafer carrier positioning structure, which directly integrates a portion corresponding to the above guide member into the bottom face 1b of the carrier body 1 by means of welding or a screw, is known (for example, refer to paragraph 0016-0036 and FIG. 1, JP 2002-353299A).

However, in the above wafer carrier positioning structure shown in FIG. 22, 23, each of the kinematic couplings 2a has contact with the inclined planes 3a, 3a formed in the lower ends of the positioning ribs 3, 3, so as to support the weight of the carrier body 1 from underneath.

For this reason, there is a problem in that the entire carrier body 1 needs to be changed if the positioning ribs 3, 3 are damaged by the contact of the kinematic couplings 2a.

Since the carrier body 1 houses the semiconductor wafers W, the carrier body 1 requires a structure which is made of a relatively expensive highly-pure resin material and also has an antistatic function. Therefore, it is expensive to change the entire carrier body 1.

Moreover, as illustrated in FIG. 24, in the wafer carrier positioning structure, which fits the boss portions provided in the bottom face 1b of the carrier body 1 into the boss holes 5a formed in the bottom plate 5, so as to perform the positioning, the bottom plate 5 can be reliably fastened to the bottom face 1b of the carrier body 1 by tightly fitting the boss portions into the boss holes 5a, while improving the positional accuracy in the directions along the bottom face 1b. However, when attaching the bottom plate 5 onto the bottom face 1b and also detaching the bottom plate 5 from the bottom face 1b, the working property may be decreased, and also when exceeding the tolerance, the bottom plate 5 may be damaged.

Furthermore, in a method for visually confirming a fitting degree, it is difficult to confirm whether the bottom plate 5 is reliably fastened in the inward and outward direction (vertical direction) of the bottom face 1b.

In the wafer carrier positioning structure, which integrates the guide member into the bottom face of the carrier body by means of a screw, the portion corresponding to the guide member may be damaged by the contact of the kinematic couplings 2a. In the case of mounting the carrier body 1 onto the device 2 and demounting the carrier body 1 from the device 2, if the retaining feature 5b is deformed, worn away or damaged, it is necessary to change the entire carrier body 1 or unfasten the screw to fasten a new guide member onto the bottom face of the carrier body.

As described above, in the case of attaching the new guide member, it is necessary to reliably locate the guide member on the bottom face of the carrier body, so as to fasten the guide member onto the bottom face. For this reason, the number of working steps required for changing the guide member is increased. Thus the costs for changing the guide member are increased.

Accordingly, there is a need for a wafer carrier positioning structure capable of easily attaching a guide member to an exact position and also capable of using a carrier body at low cost by changing only a guide member.

SUMMARY OF THE INVENTION

One aspect of the present invention relates to a wafer carrier positioning structure, including: a carrier body including a bottom face and a frame body provided in a peripheral part of the bottom face to project downwardly, for housing a wafer inside thereof parallel to the bottom face; a guide member detachably attached to the bottom face of the carrier body; a guide groove provided in the guide member, for engaging with a positioning pin projecting from a mounting face upon mounting the carrier body to the mounting face, so as to guide the carrier body to a regular mounting position; and a locking portion provided in the guide member, for locking to an inside face of the frame body while elastically having contact with the inside face.

Another aspect of the present invention relates to a wafer carrier positioning structure, including: a carrier body including a bottom face and a pair of parallel guide components, for housing a wafer inside thereof parallel to the bottom face, the pair of parallel guide components being provided in the bottom face along a radial direction of the wafer; a guide member detachably attached to the bottom face of the carrier body; and a guide groove provided in the guide member, for engaging with a positioning pin projecting from a mounting face upon mounting the carrier body on the mounting face, so as to guide the carrier body to a regular mounting position. Further, the guide groove includes: an elongated hole portion for engaging with the pair of parallel guide components; and a guide face portion provided underneath of the elongated hole portion, for controlling a distance between the positioning pin and the carrier body, so as to form a space between a leading end portion of the positioning pin and leading end portions of the parallel guide components, with the positioning pin engaging with the guide face portion.

Preferably, the wafer carrier positioning structure further includes: a boss portion provided in the bottom face of the carrier body; and a boss hole provided in the guide member for externally detachably fitting to the boss portion, wherein the boss portion including an outer circumference provided with a rib portion having a predetermined height from the bottom face of the carrier body, and the rib portion being in contact with an outer circumference of the boss hole.

Advantageously, the guide member includes a plurality of arm portions each extending substantially from a center of the guide member in a radial pattern in a radial direction of the wafer, each of the arm portions includes an elastic piece having a locking claw as the locking portion formed in a vicinity of the boss hole, and the frame body includes a locking hole to which the locking claw is lockable.

DETAILED DESCRIPTION OF THE INVENTION

Embodiment 1

Next, a wafer carrier positioning structure according to an embodiment 1 of the present invention will be explained with reference to FIGS. 1-21.

In addition, the same reference numbers will be used in the parts which are identical or similar to the parts of the above examples.

Figure 1:
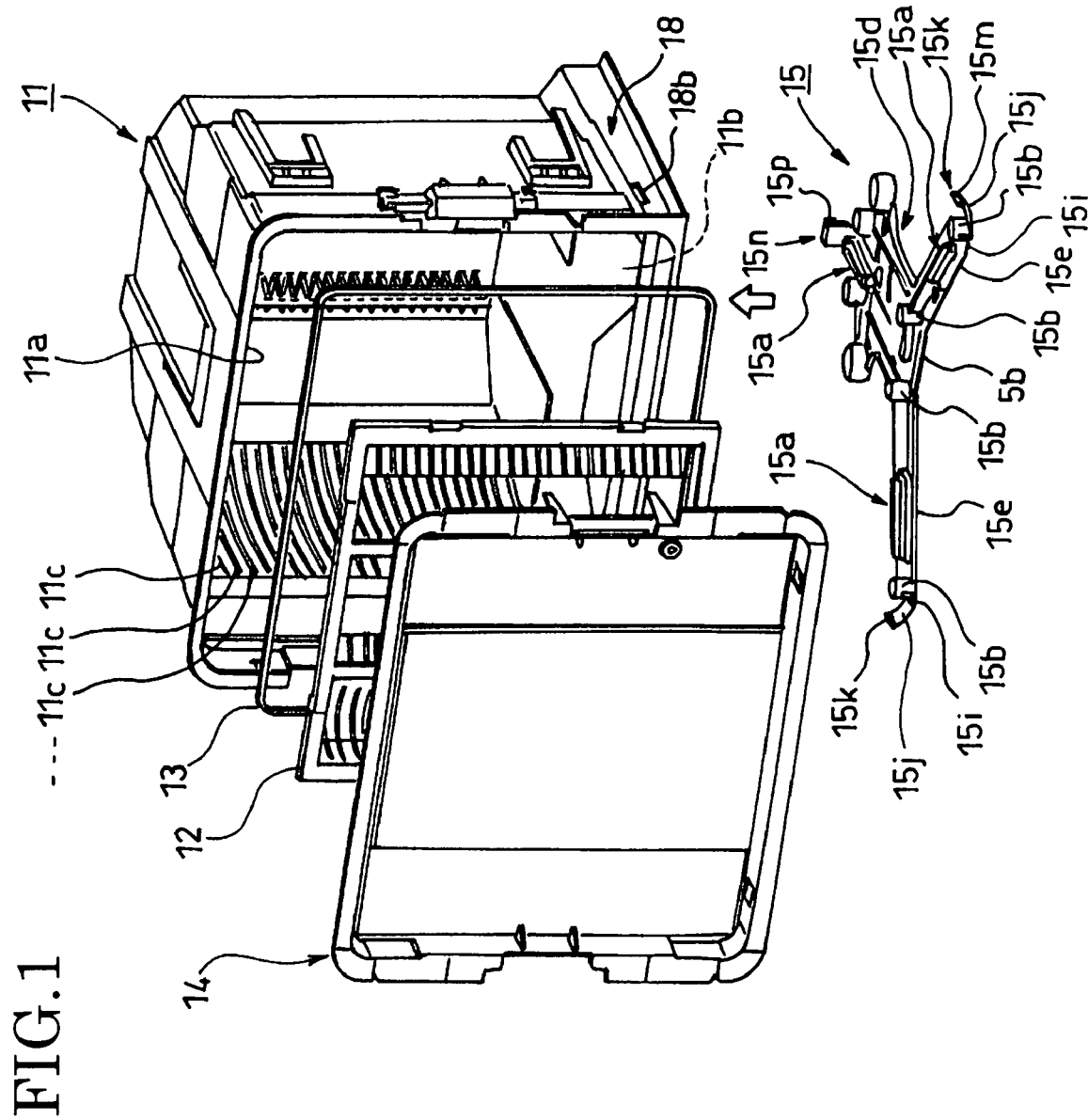
FIG. 1 is an exploded perspective view of a wafer carrier explaining an entire structure of a wafer carrier positioning structure.

Initially, a structure of a wafer carrier will be explained. Referring to FIG. 1, a wafer carrier according to the present embodiment includes a carrier body 11 substantially having a box shape. The carrier body 11 includes at one side thereof an opening 11a through which a semiconductor wafer W as a wafer is placed in and taken out.

The carrier body 11 includes inside thereof a plurality of aligned ribs 11c. The aligned ribs are formed to horizontally laminate the semiconductor wafers W (not shown) at intervals, so as to house the semiconductor wafers W in the carrier body 11.

Moreover, the wafer carrier includes a wafer retainer 12 for retaining the semiconductor wafers W as the wafers housed in the carrier body 11, a lid 14 for opening and closing the opening 11a of the carrier body 11, and a sealing member 13 sandwiched between the peripheral part of the opening 11a and the peripheral part of the lid 14.

In addition, the wafer carrier includes a bottom plate 15 as a guide member. The bottom plate 15 is detachably attached to a bottom face 11b of the carrier body 11. The bottom plate 15 includes guide grooves 15a. When the carrier body 11 is mounted onto the mounting face 2b of an automatic wafer transfer device 2, the guide grooves 15a engage with kinematic couplings as positioning pins 2a provided in the mounting face 2b, so as to guide the carrier body 11 to a suitable mounting position.

Figure 2:
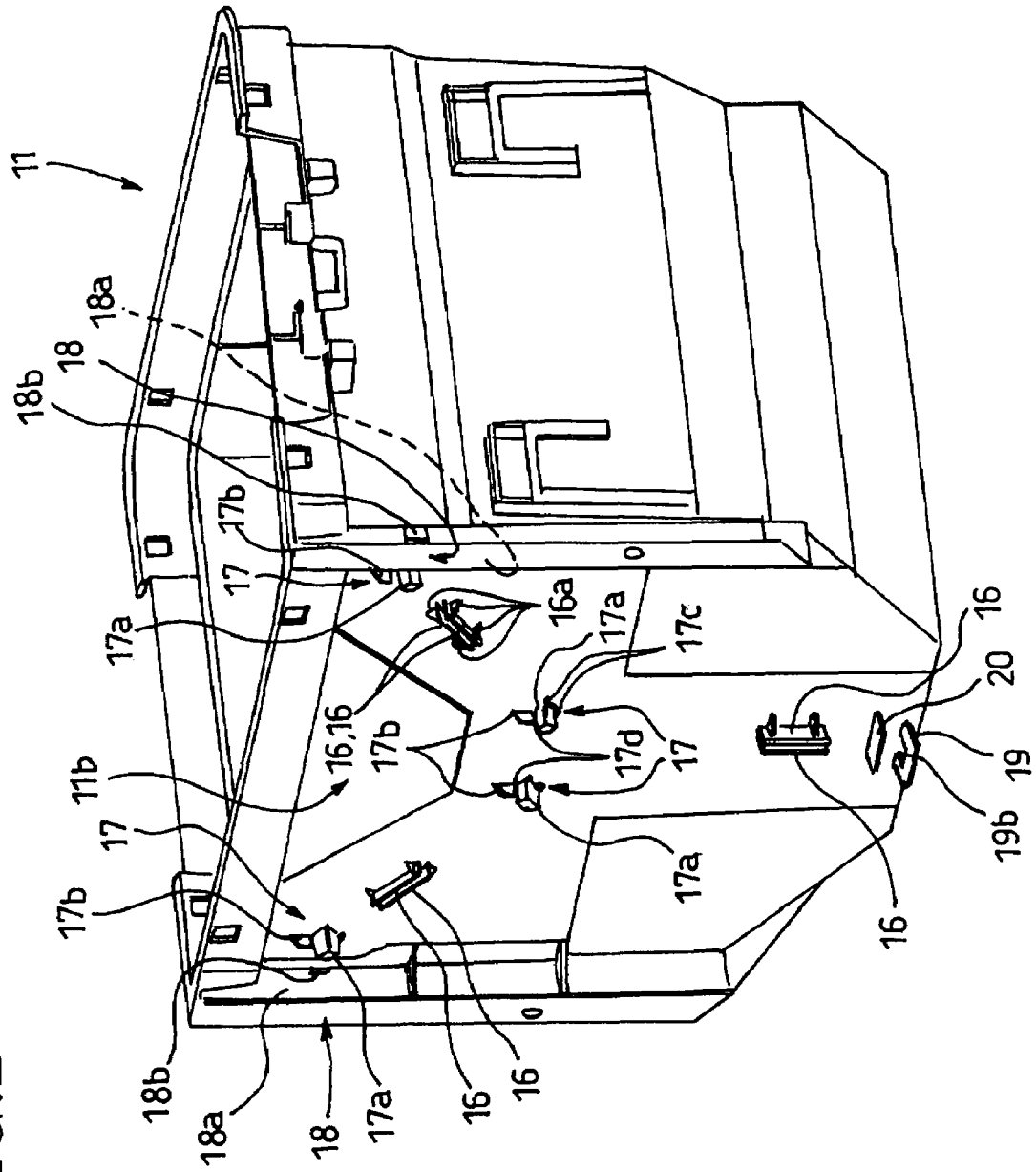
FIG. 2 is a perspective view explaining a structure of a bottom face of a carrier body according to a wafer carrier positioning structure of embodiment 1 of the present invention.
Figure 3:
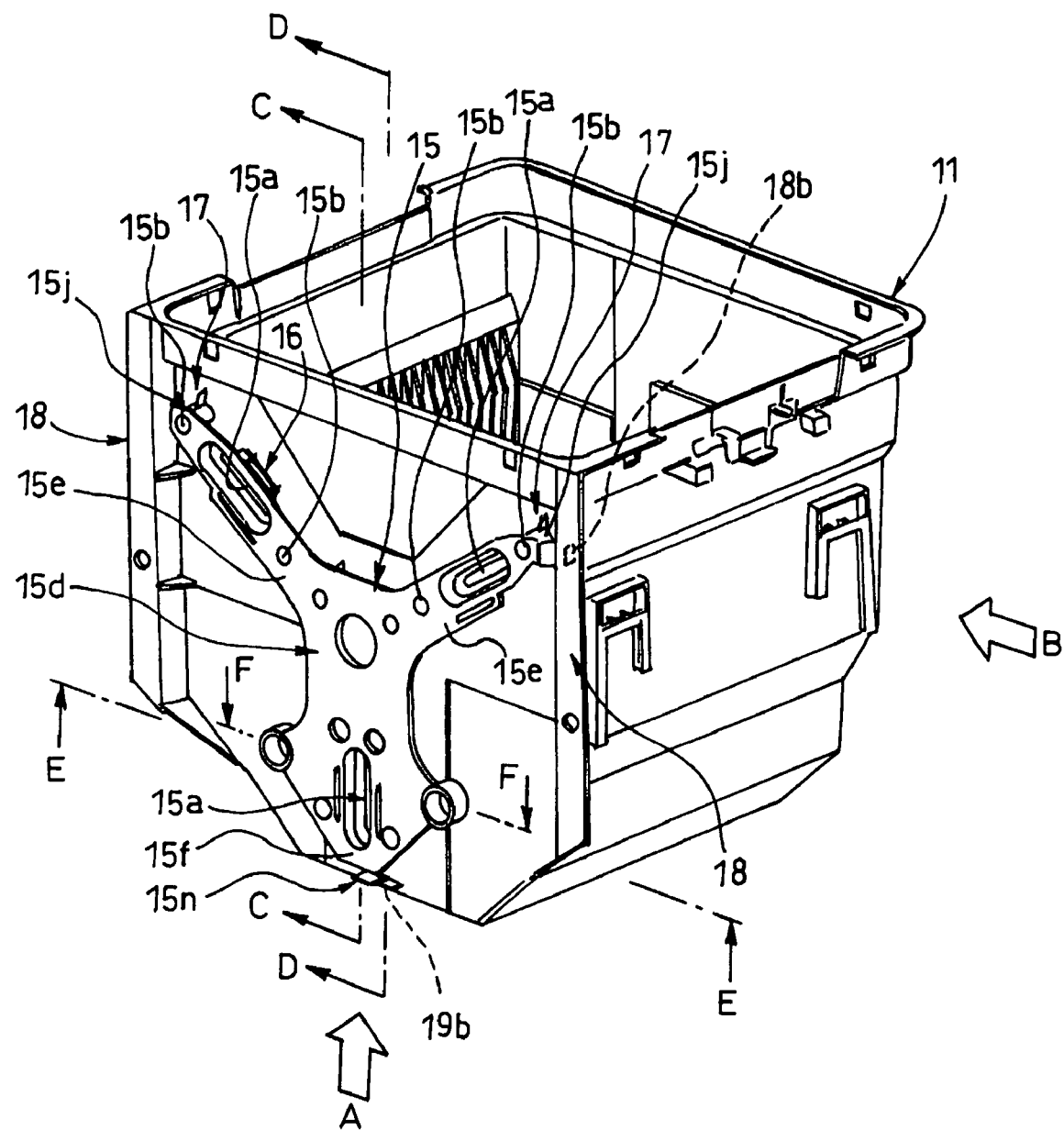
FIG. 3 is a perspective view showing a state in which a bottom plate is attached to the bottom face of the carrier body according to the wafer carrier positioning structure of the embodiment 1 of the present invention.

Referring to FIG. 2, the bottom face 11b includes three pairs of positioning ribs 16, 16 as parallel guide components. Each pair of the positioning ribs includes a pair of positioning ribs 16, 16 arranged to be parallel to each other in the radial direction of the semiconductor wafer W housed in the carrier body 11. The three pairs of positioning ribs are provided in the right and left portions of the bottom face 11b on the opening 11a side and the central portion of the peripheral portion of the bottom face 11b on the side opposite the opening 11a, so as to substantially be positioned in the vicinity of apexes of a triangle shape in plan view and to form a radial pattern.

Figure 13:
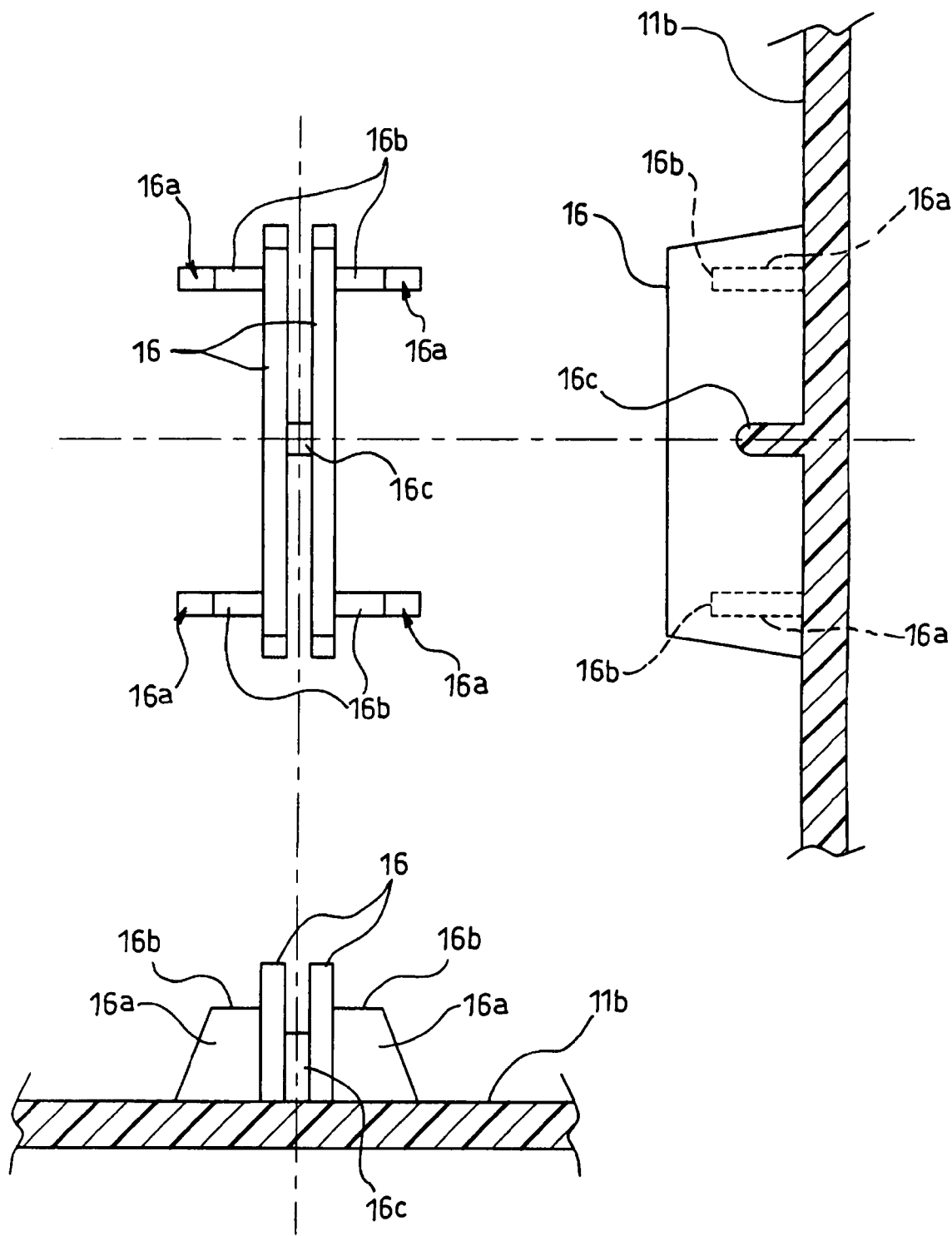
FIG. 13 is a view showing three faces of a pair of positioning ribs used for the wafer carrier positioning structure according to the embodiment 1 of the present invention.

As illustrated in FIG. 13, each of the positioning ribs 16 according to the present embodiment substantially has a trapezoidal shape in lateral view having a horizontal upper end. Each pair of the positioning ribs 16, 16 includes two pairs of reinforcement ribs 16a, 16a which are integrated therewith. The two pairs of reinforcement ribs 16a, 16a are formed to extend in the right and left directions of the positioning rib 16.

The top face of each of the reinforcement ribs 16a includes a horizontal contact face portion 16b.

A pair of the positioning ribs 16, 16 is connected by a coupling rib 16c disposed between a pair of the positioning ribs 16, 16 in the center of the longitudinal direction of the positioning rib 16. The coupling rib 16c maintains the suitable positioning of the positioning ribs 16, 16.

Figure 8:
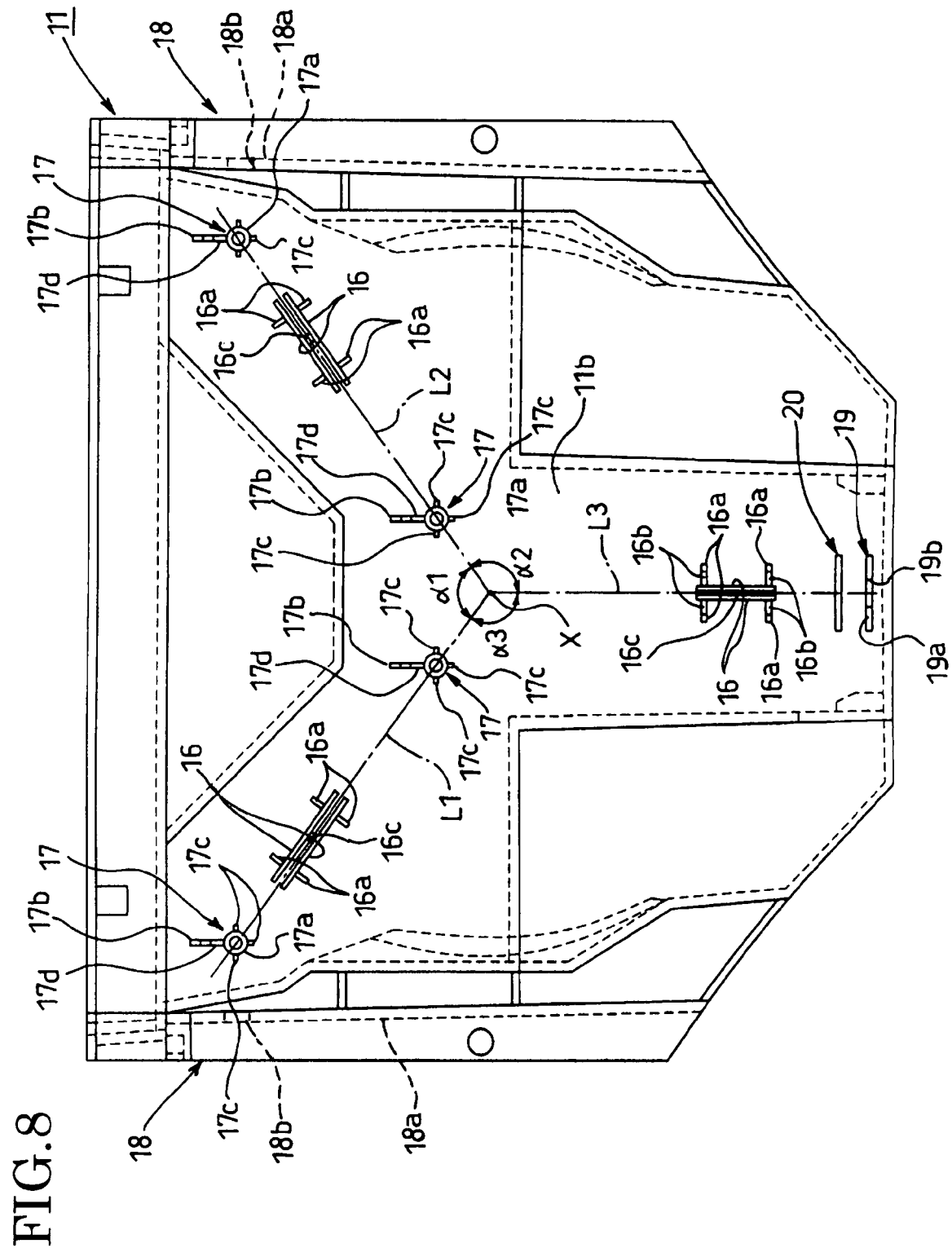
FIG. 8 is a plan view showing the structure of the bottom face of the carrier body used for the wafer carrier positioning structure according to the embodiment 1 of the present invention.
Figure 9:
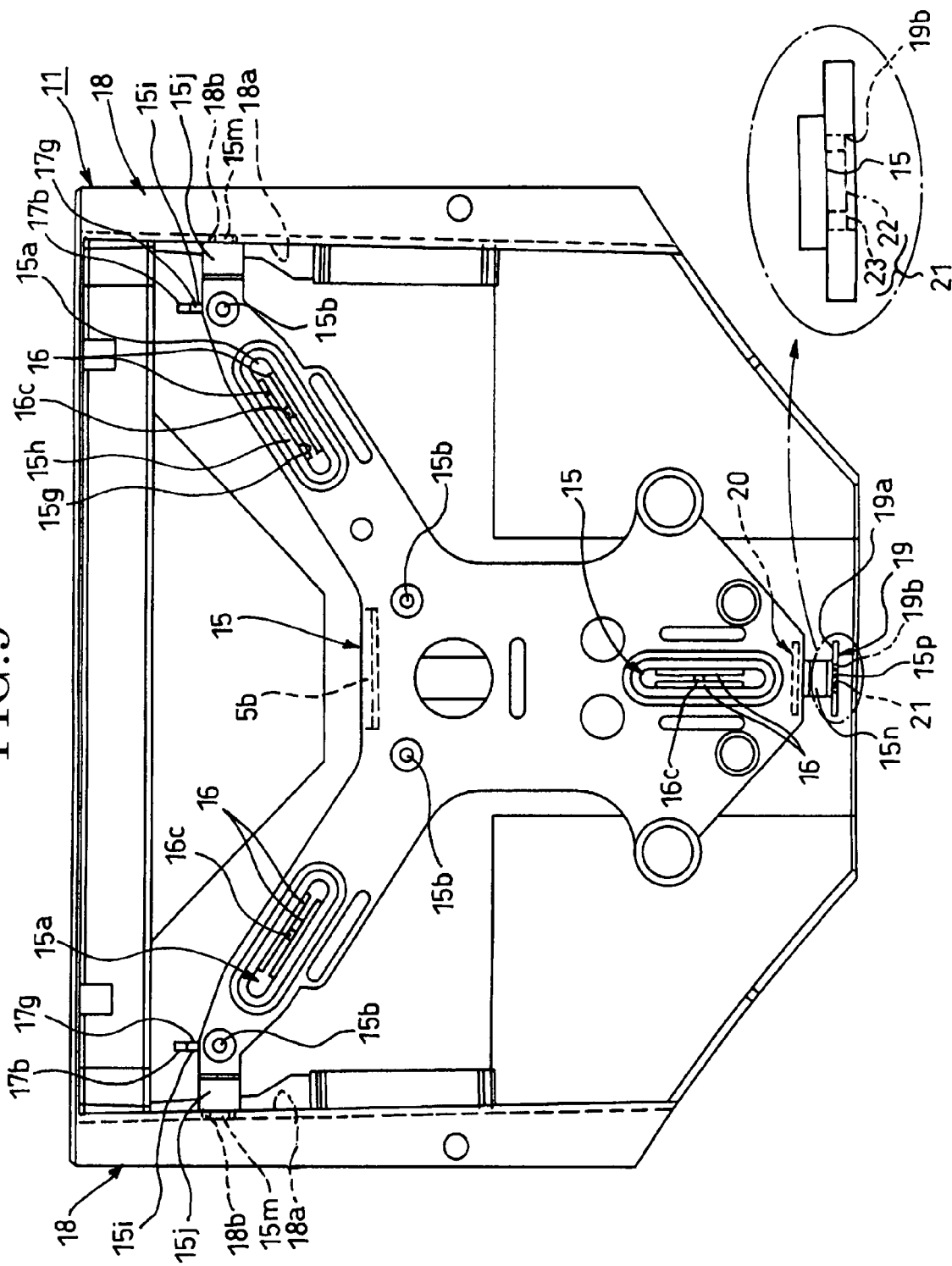
FIG. 9 is a plan view showing a structure in which the bottom plate is attached to the bottom face of the carrier body used for the wafer carrier positioning structure according to the embodiment 1 of the present invention.
Figure 10:
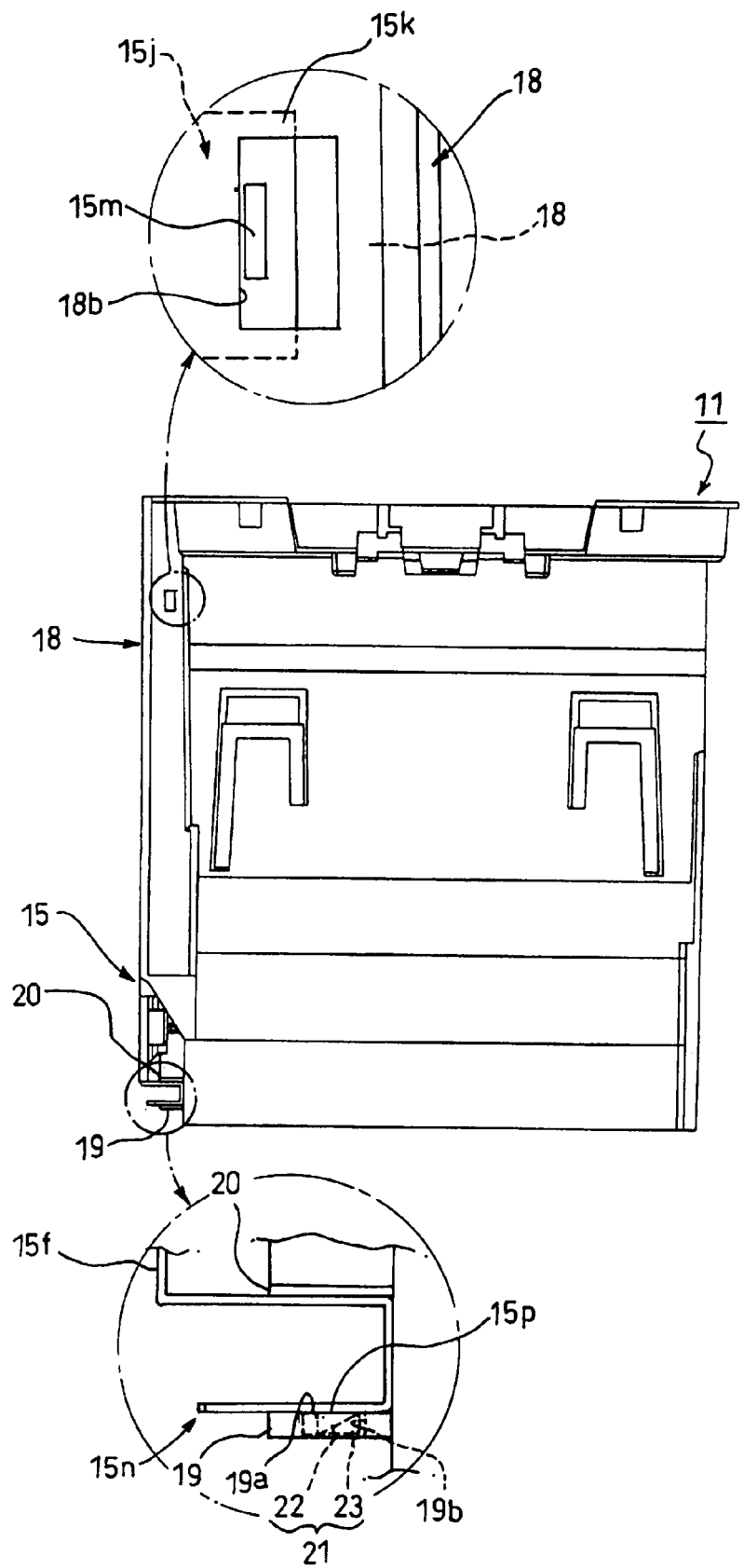
FIG. 10 is a side view showing a structure in which the bottom plate is attached to the bottom face of the carrier body used for the wafer carrier positioning structure according to the embodiment 1 of the present invention.

As illustrated in FIG. 8, the carrier body 11 of the present embodiment is set, such that an intersecting point X of virtual extended lines L1-L3 of the positioning ribs 16 is located substantially at the center of the bottom face 11b and each of the angles α1, α2, α3 between each of the virtual extended lines L1, L2, L3 becomes about 120°.

The bottom face 11b of the carrier body 11 also includes a plurality of boss portions 17.

A pair of boss portions 17, 17 to which a pair of boss holes 15b, 15b formed on the bottom plate 15 is externally fitted is disposed in a position close to the intersecting point X and a position away from the intersecting point X, respectively, on each of the vertical extended lines L1, L2 of the positioning ribs 16.

Figure 14:
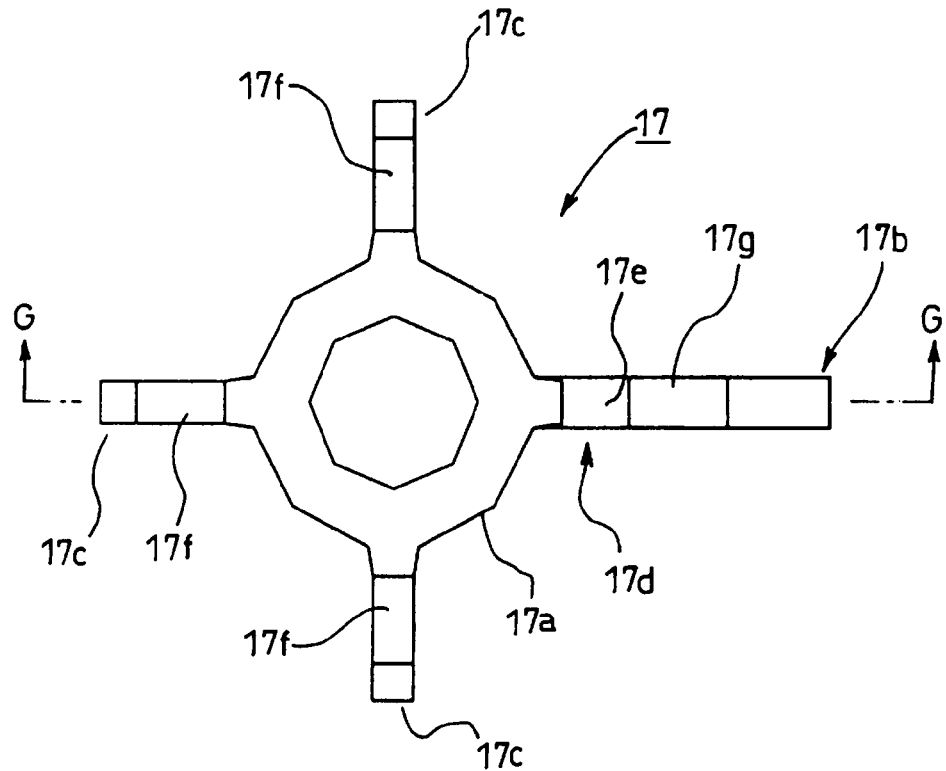
FIG. 14 is a plan view showing a boss portion used for the wafer carrier positioning structure according to the embodiment 1 of the present invention.
Figure 15:
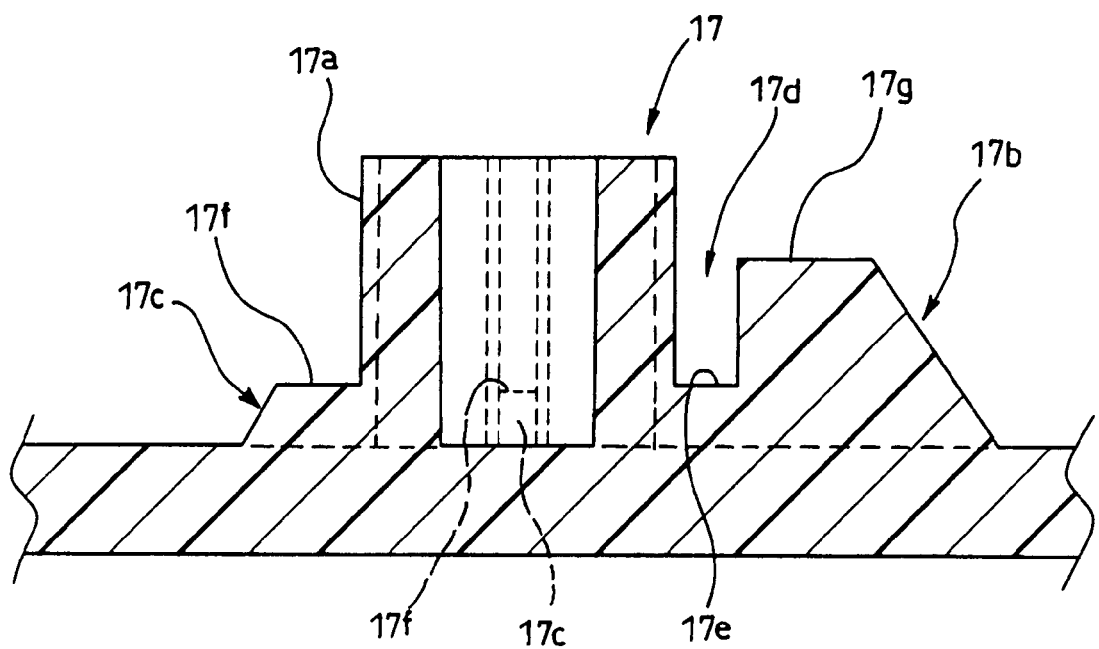
FIG. 15 is cross-sectional view along G-G line in FIG. 14 illustrating the boss portion used for the wafer carrier positioning structure according to the embodiment 1 of the present invention.

As illustrated in FIGS. 14, 15, each of the boss portions 17 of the present embodiment includes a boss body 17a substantially having a cylindrical shape, a large rib 17b and small ribs 17c. These ribs 17b, 17c each having a predetermined height from the bottom face 11b are disposed in the outer circumference of the boss body 17a at about 90° intervals.

The large rib 17b includes a concave groove portion 17d having a bottom portion 17e. With the bottom plate 15 attached to the bottom face 11b of the carrier body 11, the circumference portion of the boss hole 15b formed on the bottom plate 15 has contact with the bottom portion 17e of the groove portion 17d.

In addition, each of the small ribs 17c substantially having a trapezoidal shape in side view includes a horizontal face portion 17f. With the bottom plate 15 attached to the bottom face 11b of the carrier body 11, the circumference portion of the boss hole 15b formed on the bottom plate 15 has contact with the horizontal face portion 17f.

Further, as shown in FIG. 2, the bottom face 11b of the carrier body 11 of the present embodiment includes right and left frame bodies 18, 18 and a pair of parallel rib frame bodies 19, 20. The right and left frame bodies 18, 18 and the parallel rib frame bodies 19, 20 are formed in the peripheral part of the bottom face 11b of the carrier body 11, so as to project downwardly from the bottom face 11b of the carrier body 11.

Figure 4:
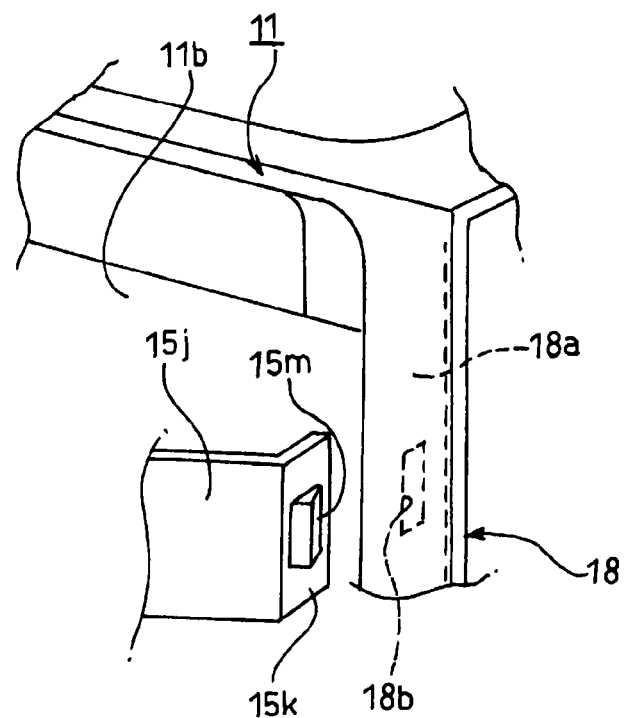
FIG. 4 is an exploded perspective view illustrating a major portion in the vicinity of an elastic piece according to the wafer carrier positioning structure of the embodiment 1 of the present invention.
Figure 5:
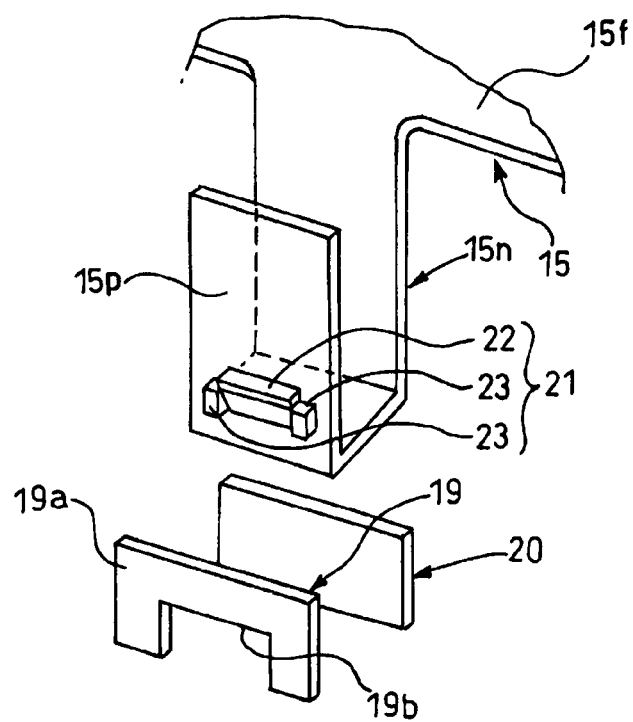
FIG. 5 is an exploded perspective view illustrating a major portion in the vicinity of a U-shaped elastic piece according to the wafer carrier positioning structure of the embodiment 1 of the present invention.

As illustrated in FIGS. 4, 5, the frame bodies 18, 18 and the rib frame bodies 19 include inner faces 18a, 18a, 19a. Each of the inner faces 18a, 18a, 19a includes a locking hole 18b, 18b, 19b substantially having a rectangular shape in front view.

Next the structure of the bottom plate 15 will be explained with reference to FIGS. 6, 7.

The bottom plate 15 according to the present embodiment is made of a material obtained by mixing a fluorine resin with a polycarbonate resin. The bottom plate 15 substantially has a Y-shape in plan view having right and left arm portions 15e, 15e and a central arm portion 15f. Each of the arm portions extends to a radial pattern from a central base portion 15d, such that the axis lines of the arm portions 15e, 15e, 15f are different to each other by about 120° intervals.

Since the bottom plate 15 is made of the material obtained by mixing a fluorine resin with a polycarbonate resin, the smoothness on the surface is improved; thus, the positioning of the kinematic coupling 2a can be facilitated.

Each of the right and left arm portions 15e, 15e and the central arm portion 15f extending from the central base portion 15d includes the guide groove 15a formed along the direction to which each of the arm portions 15e, 15e extends.

Figure 16:
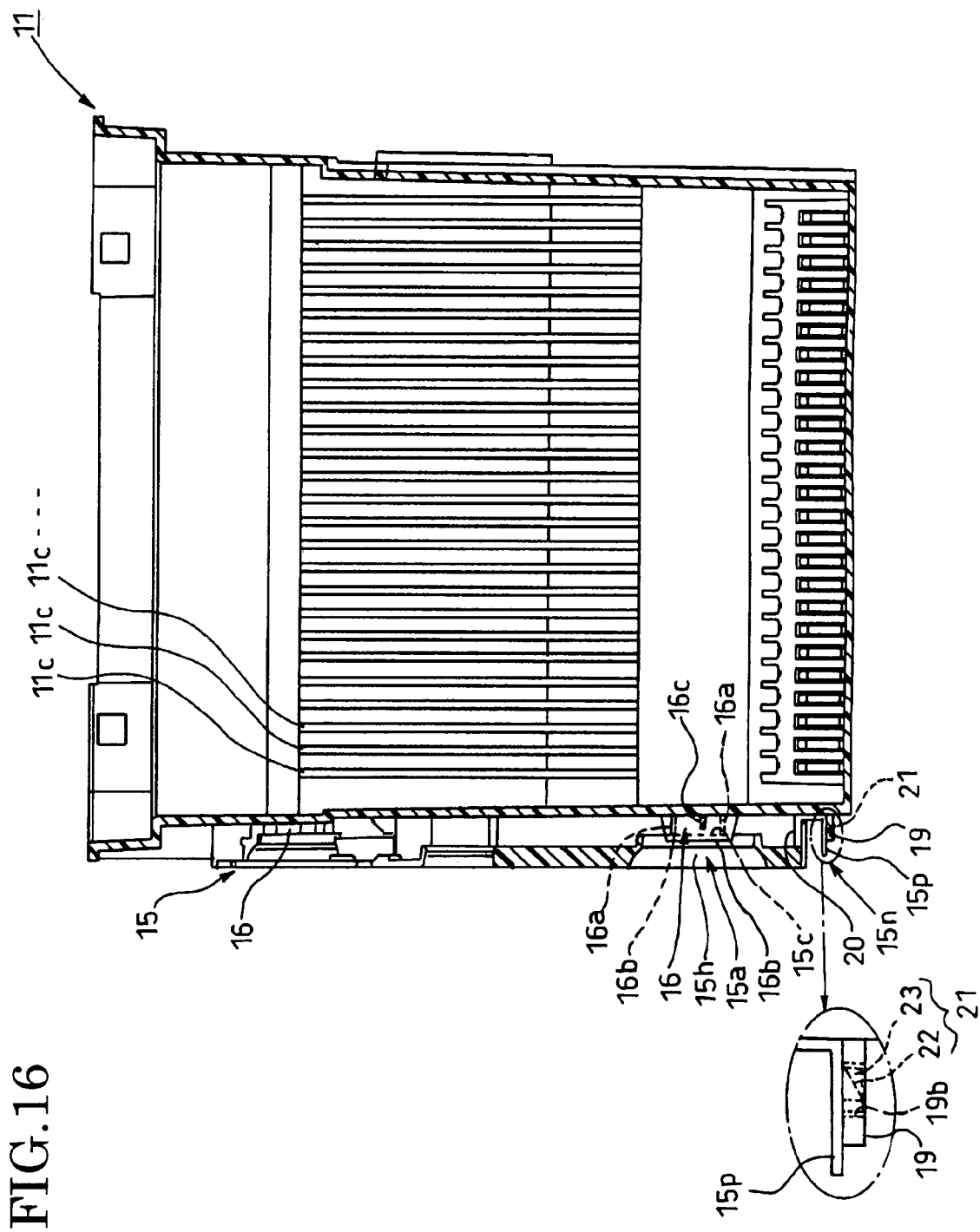
FIG. 16 is a cross-sectional view along C-C line in FIG. 3 showing a structure in which the bottom plate is attached to the bottom face of the carrier body used for the wafer carrier positioning structure according to the embodiment 1 of the present invention.
Figure 17:
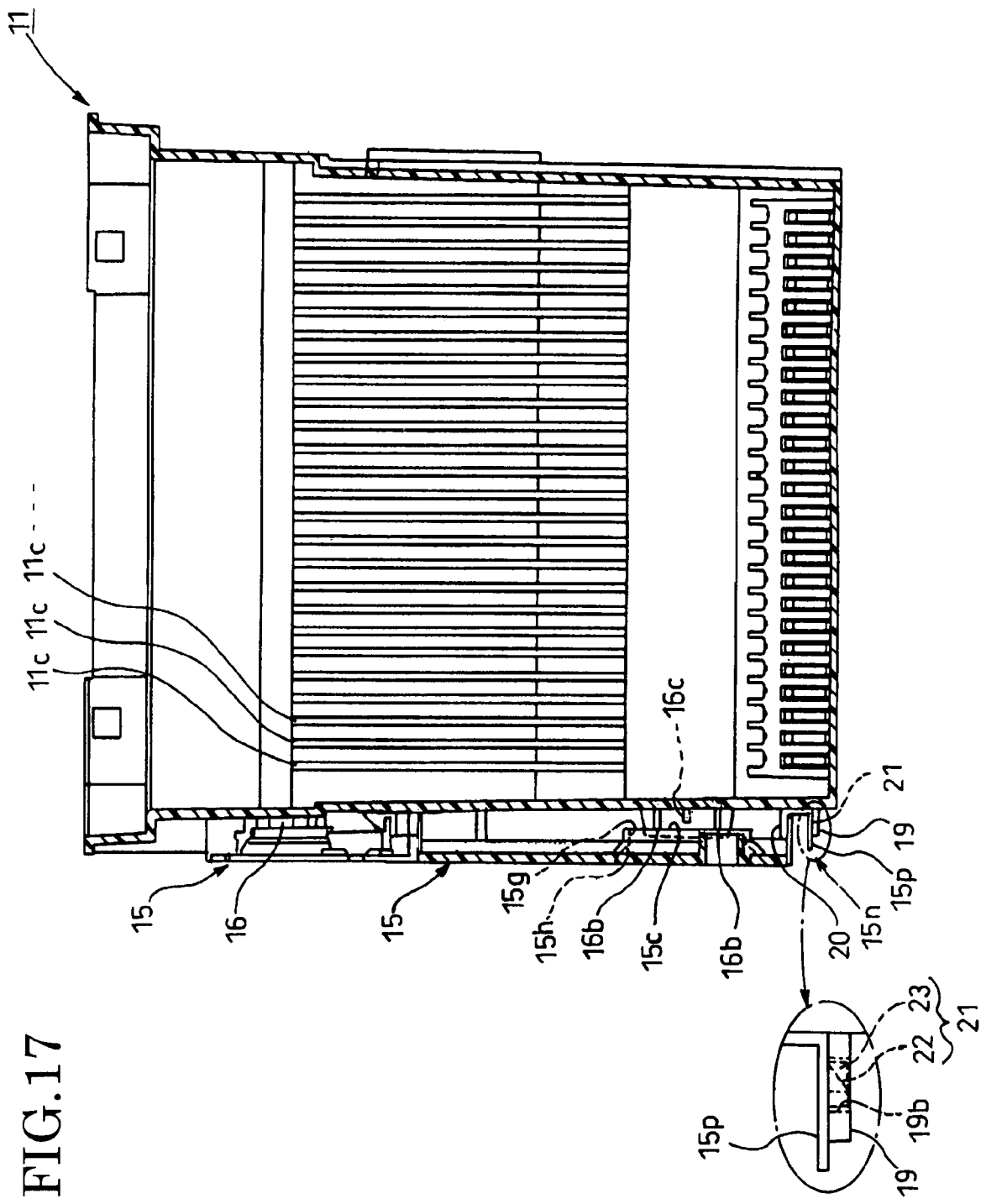
FIG. 17 is a cross-sectional view along D-D line in FIG. 3 showing a structure in which the bottom plate is attached to the bottom face of the carrier body used for the wafer carrier positioning structure according to the embodiment 1 of the present invention.
Figure 18:
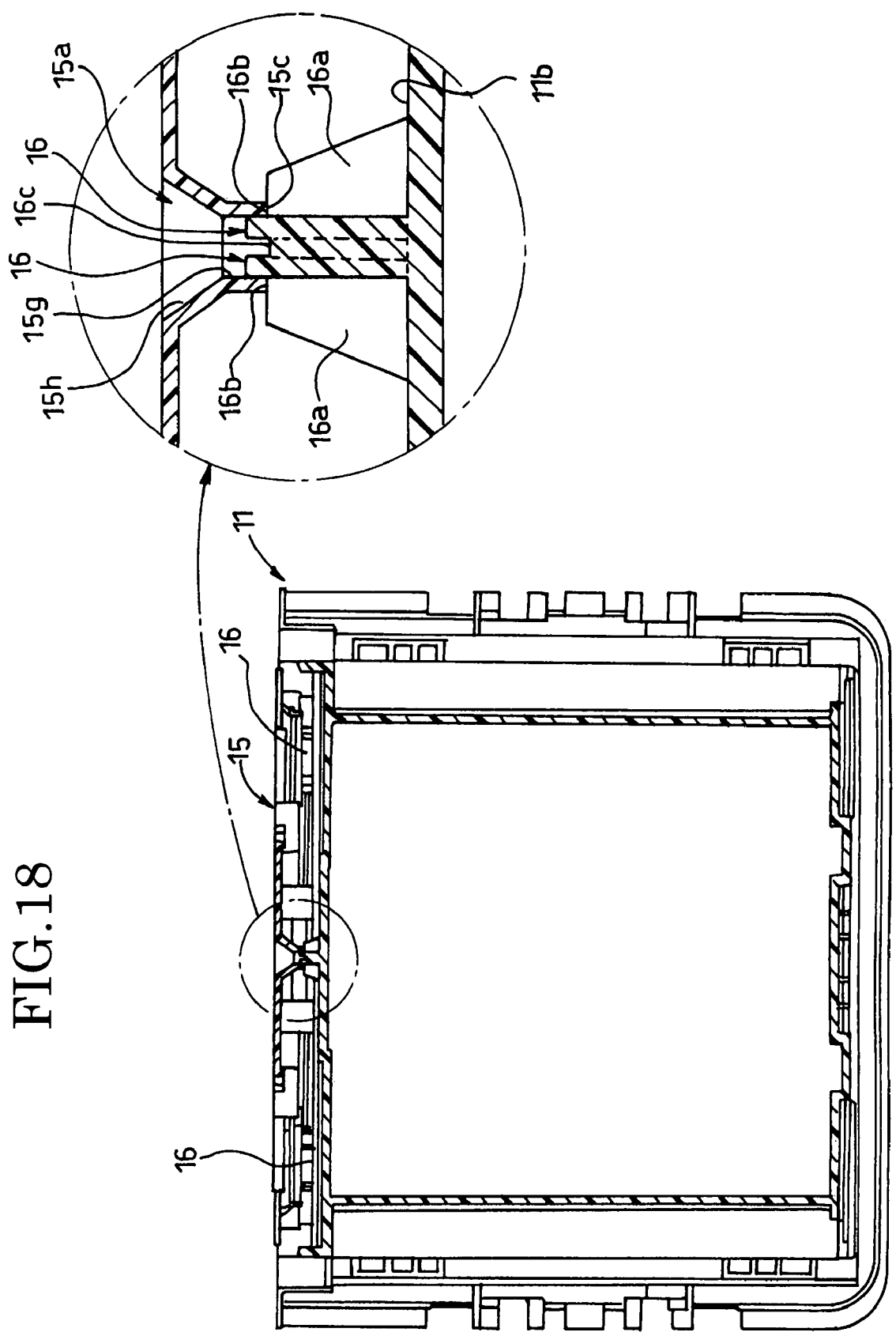
FIG. 18 is a cross-sectional view along E-E line in FIG. 3 showing a structure in which the bottom plate is attached to the bottom face of the carrier body used for the wafer carrier positioning structure according to the embodiment 1 of the present invention.

As illustrated in FIGS. 16-18, each of the guide grooves 15a includes an elongated hole portion 15g having a circumference portion 15c. With the bottom plate 15 attached to the bottom face 11b of the case body 11, the circumference portion 15c has contact with the horizontal contact face portions 16b of the reinforcement ribs 16a. The elongated hole portion 15g engages with a pair of positioning ribs 16, 16 and guides a pair of positioning ribs 16, 16, to a regular position along the longitudinal direction of the elongated hole portion 15g, as shown in FIG. 19.

Figure 19:
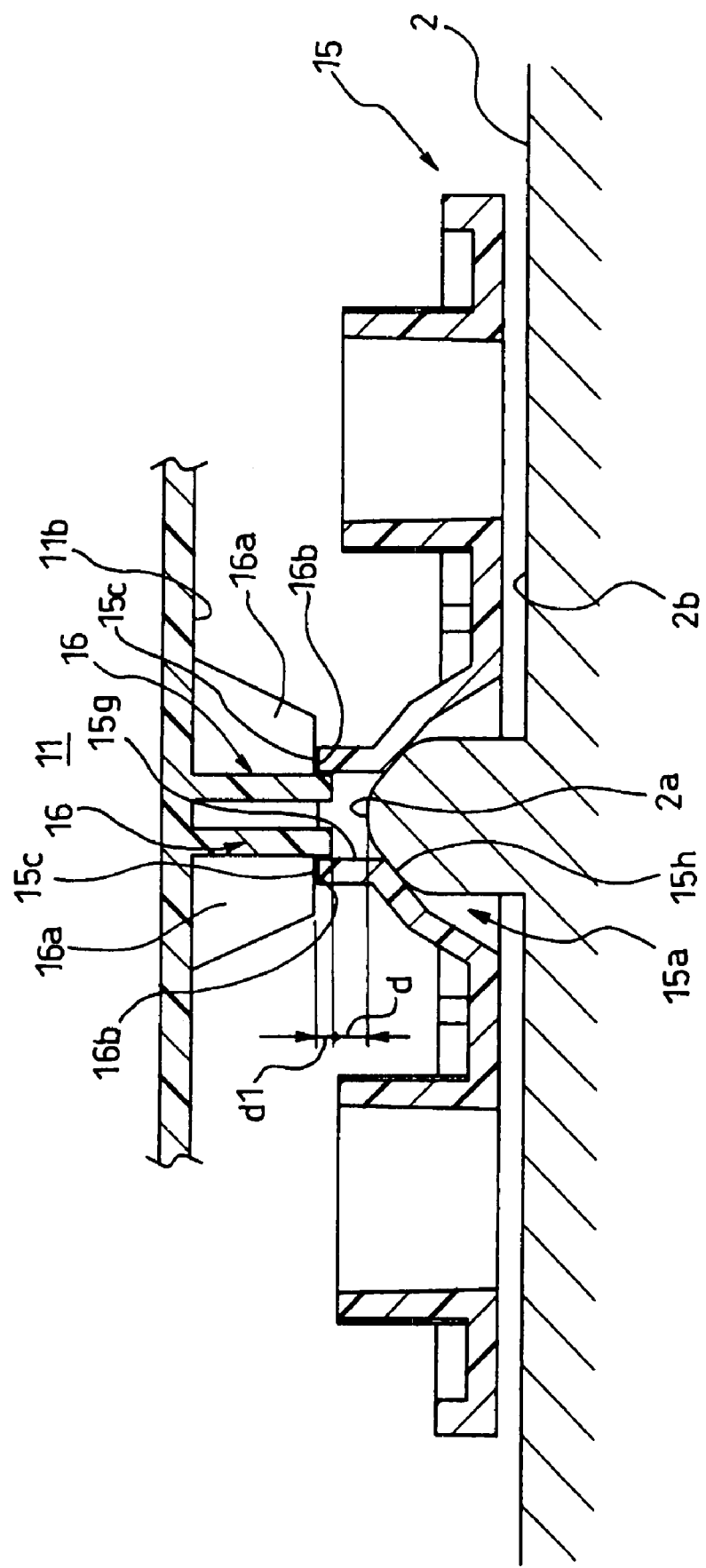
FIG. 19 is a cross-sectional view along F-F line in FIG. 3 showing a structure in which the bottom plate is attached to the bottom face of the carrier body used for the wafer carrier positioning structure according to the embodiment 1 of the present invention.

The guide groove 15a also includes a guide plane 15h for guiding the kinematic coupling 2a to a regular position as shown in FIG. 19. The guide groove 15a has a funnel shape in cross section in the width direction.

As shown in FIG. 19, the guide plane 15h is formed to be disposed underneath the elongated hole portion 15g. The guide plane 15h is configured to form an interval D between the leading end portion of the kinematic coupling 2a and the leading end portions of the positioning ribs 16, with the kinematic coupling 2a as the positioning pin engaging with the guide plane 15h, so as to control the distance between the kinematic coupling 2a and the carrier body 11.

Figure 7:
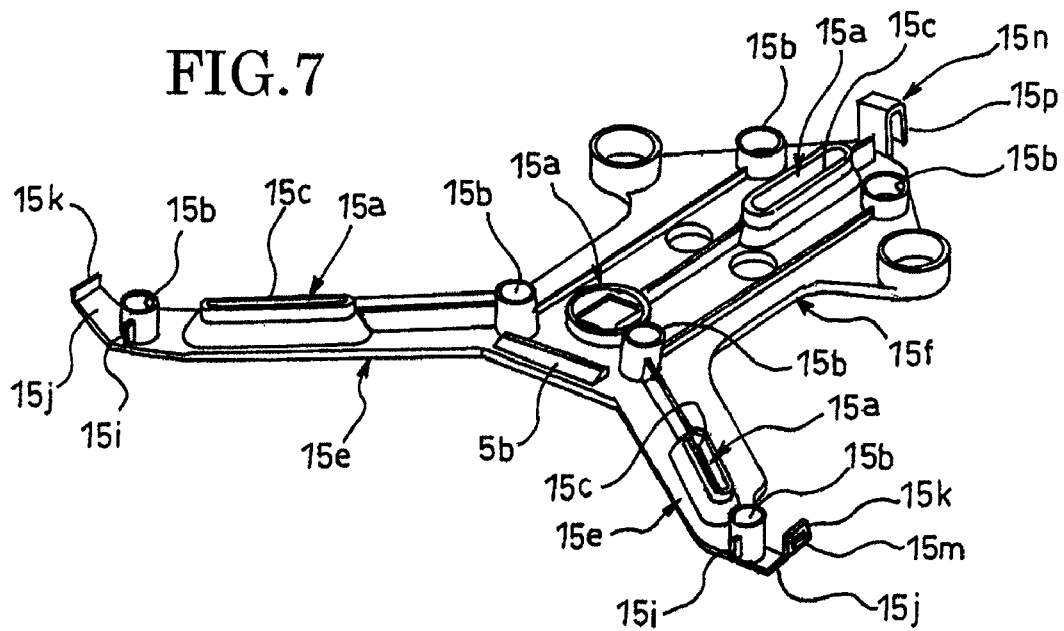
FIG. 7 is a perspective view showing the bottom plate as seen from the upper face, which is used for the wafer carrier positioning structure according to the embodiment 1 of the present invention.

In the wafer carrier positioning structure according to the present embodiment, as shown in FIG. 7, a pair of the boss holes 15b, 15b is formed on each of the right and left arm portions 15e of the bottom plate 15. A pair of the boss holes 15b, 15b is disposed in a position close to the central base portion 15d and in a position away from the central base portion 15d of the bottom plate.

Each of the boss holes 15b disposed in a position away from the central base portion 15d has a rib portion 15i provided in the circumference portion of the boss hole 15b.

Figure 12:
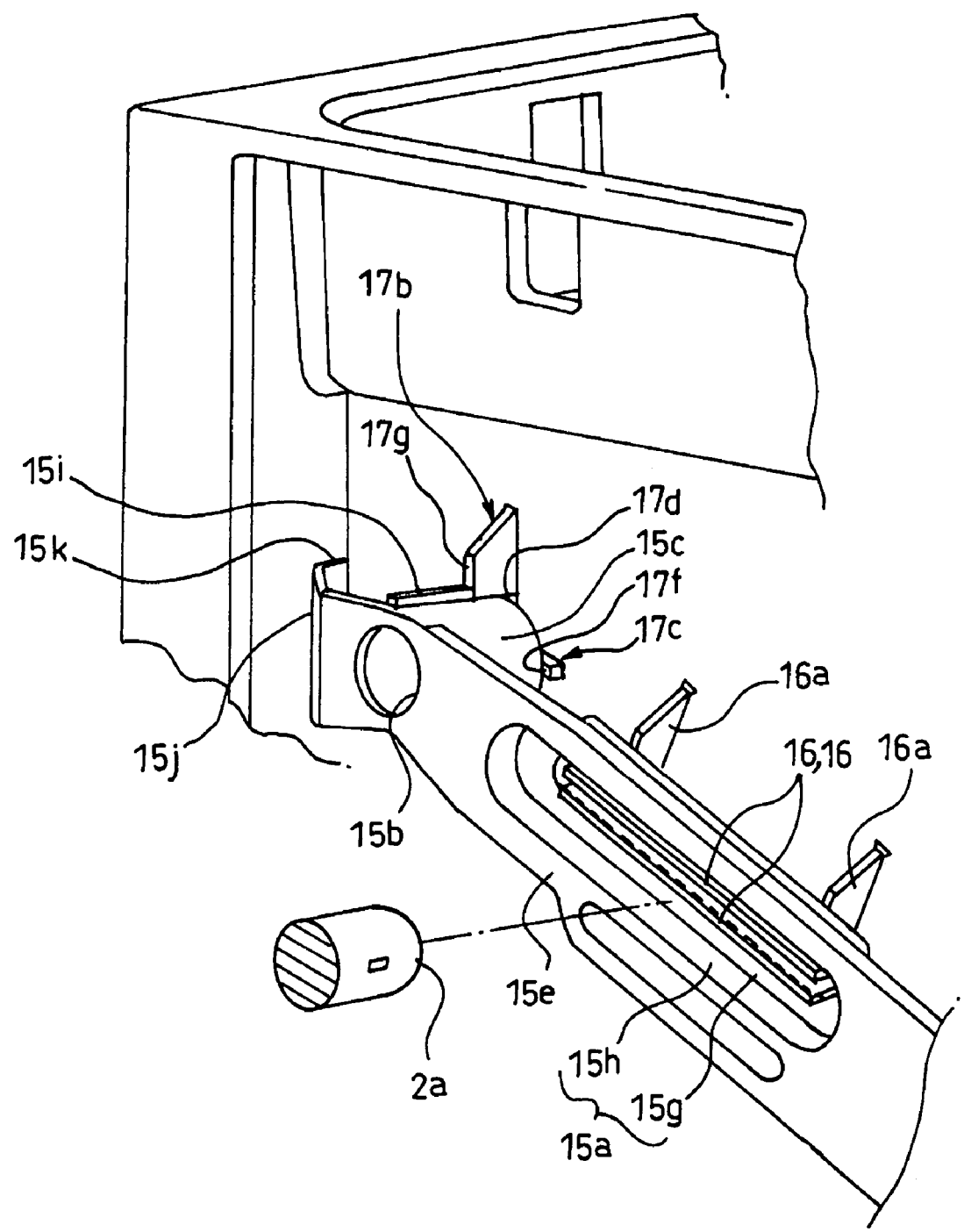
FIG. 12 is an exploded perspective view of a major portion showing a state in which a locking claw is locked to a locking hole for attaching the bottom plate to the bottom face of the carrier body used for the wafer carrier positioning structure according to the embodiment 1 of the present invention.

As shown in FIG. 12, if each of the boss holes 15b is externally fitted to the boss body 17a of each of the boss portions 17, and the upper end of the circumference portion of the boss hole 15b has contact with the bottom portion 17e of the large rib 17b and the horizontal face portions 17f of the ribs 17b, 17c, such that the boss hole 15b is externally fitted to a regular fitting position, the rib portion 15i has contact with an upper end portion 17g of the large rib 17b.

Figure 6:
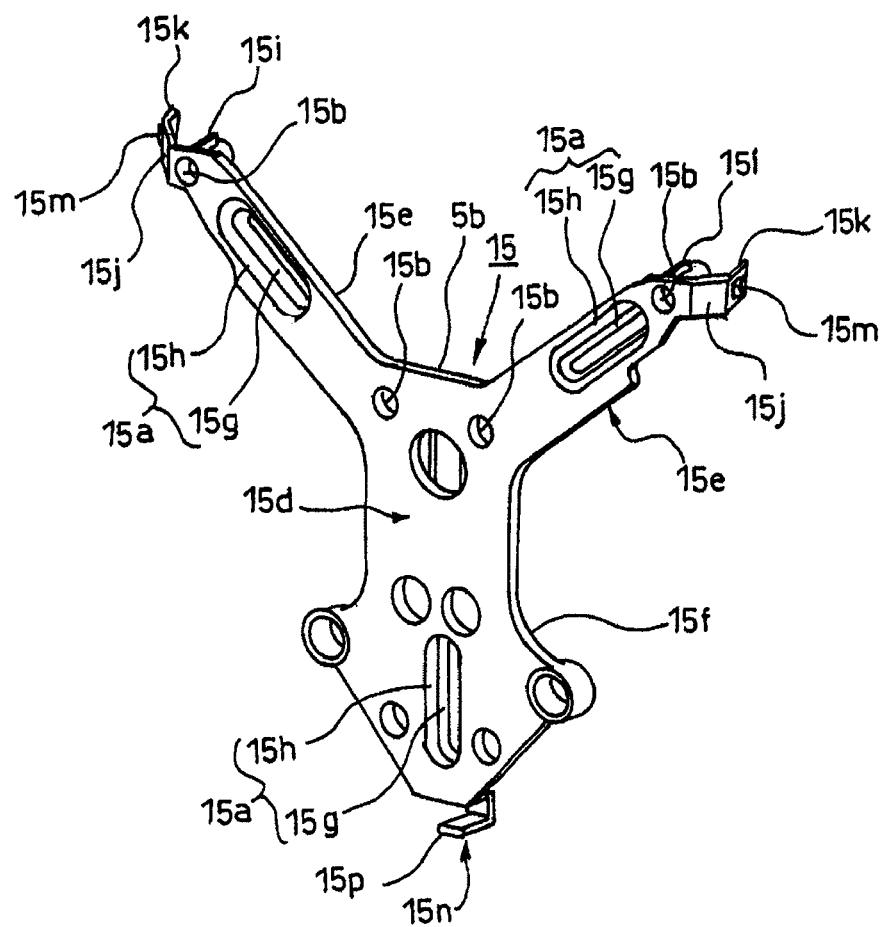
FIG. 6 is a perspective view showing the bottom plate as seen from the lower face, which is used for the wafer carrier positioning structure according to the embodiment 1 of the present invention.
Figure 11:
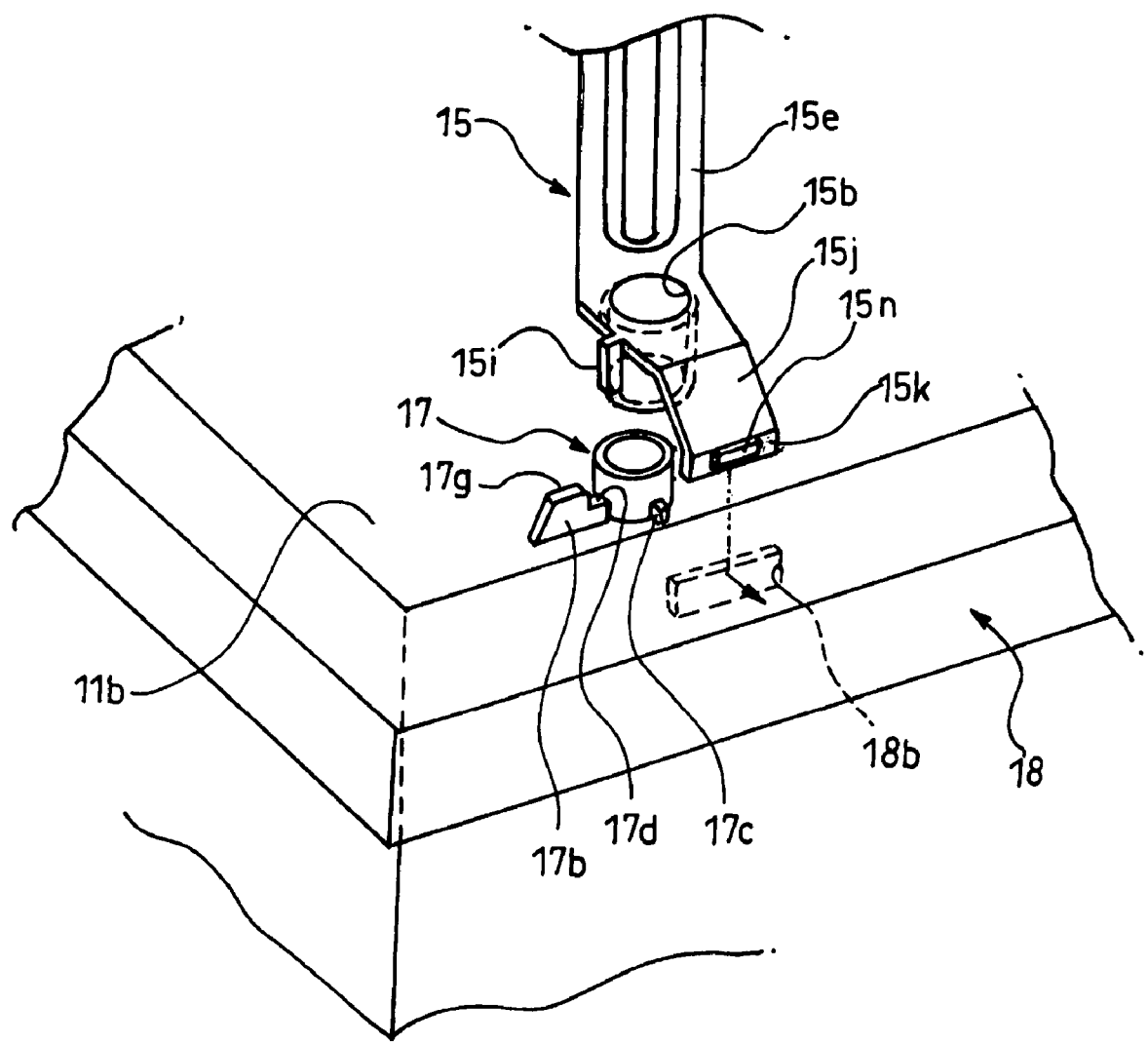
FIG. 11 is an exploded perspective view of a major portion showing a state which locks a locking claw to a locking hole, when attaching the bottom plate to the bottom face of the carrier body used for the wafer carrier positioning structure according to the embodiment 1 of the present invention.

As shown in FIGS. 6, 7, 11, the leading end portion of each of the right and left arm portions 15e, 15e includes a planar elastic piece 15j. The elastic piece 15j outwardly extends from the leading end portion of each of the arm portions 15e, 15e, so as to bend upwardly.

Each of the elastic pieces 15j has a leading end portion provided with an elastic opposing face portion 15k. Each of the elastic opposing face portions 15k is opposed to the inner face 18a of each of the right and left frame bodies 18, and extends in the direction such that the boss hole 15b is externally fitted to the boss portion 17.

As shown in FIG. 4, each of the opposing face portions 15k includes a locking claw 15m formed as a locking portion, which is locked to the locking hole 18b formed in each of the inner faces 18a.

The central arm portion 15f extending from the central base portion 15d includes a leading end portion provided with a U-shaped elastic piece 15n formed as an elastic piece having a U-shape in cross section. The U-shaped elastic piece 15n is integrated with the leading end portion of the central arm portion 15f, as shown in FIGS. 5, 7.

As shown in FIG. 7, the U-shaped elastic piece 15n opens downwardly and includes an opposing face portion 15p. The opposing face portion 15p is opposed to the inside face 19a of the rib frame body 19, with the U-shaped elastic piece disposed between the parallel rib frame bodies 19, 20, and extends in a direction such that the boss hole 15d is externally fitted to the boss portion 17.

The opposing face portion 15p includes a locking claw portion 21 as a locking claw which is locked or unlocked with respect to the locking hole 19b formed in the inside face 19a.

As shown in FIG. 5, the locking claw portion 21 of the present embodiment includes a locking claw 22 for preventing separation in the up and down directions, and a right side locking claw 23 and a left side locking claw 23 disposed on the right side and left side of the locking claw 22 for preventing movement in the right and left directions.

Next, the operations and effects of the present embodiment will be explained.

In the wafer carrier positioning structure according to the present embodiment, when attaching the bottom plate 15 onto the bottom face 11b of the carrier body 11, each of the boss holes 15b is externally fitted to each of the boss portions 17 of the bottom face 11b, while inserting each pair of the positioning ribs 16, 16 into each of the guide grooves 15a.

Then, the locking claws 15m of each of the opposing face portions 15k provided in each of the right and left arm portions 15e, 15e is inserted into each of the engaging holes 18b provided in each of the right and left frame bodies 18 while elastically having contact with the inside face 18a of each of the right and left frame bodies 18 from inside. The locking claw 15m is thereby locked to the locking hole 18b.

Therefore, in the right and left directions, the bottom plate 15 is centralized in a suitable mounting position which is the center of the bottom face 11b of the carrier body 11.

Moreover, if the U-shaped elastic piece 15n integrally formed in the leading end portion of the central arm portion 15f of the bottom plate 15 is disposed between the parallel rib frame bodies 19, 20, while elastically deforming, the bottom plate 15 is positioned with respect to the bottom face 11b of the carrier body 11 in the front and back directions. Accordingly, the bottom plate 15 is precisely positioned in the bottom face 11b in the directions that the bottom 11b extends (front and back directions and right and left directions).

Furthermore, if the U-shaped elastic piece 15n integrally formed in the leading end portion of the central arm portion 15f of the bottom plate 15 is disposed between the parallel rib frame bodies 19, 20 while elastically deforming, the locking claw portion 21 formed in the opposing face portion 15p, which is opposed to the inside face 19a of the rib frame body 19, is inserted into the locking hole 19b formed in the inside face 19a.

Then, the locking claw 22 of the locking claw portion 21 is locked to the lower peripheral part of the locking hole 19b, so as to prevent the separation, and also the locking claws 23, 24 provided on the right and left sides of the locking claw 22 are locked to the right and left peripheral parts of the locking hole 19*b*, so as to control the movement in the right and left directions in the end portion of the central arm portion 15*f*.

Therefore, the bottom plate 15 is precisely positioned with respect to the bottom face 11*b* of the carrier body 11 in the directions that the bottom face 11*b* extends (front and back directions and right and left directions), so as to be fastened to the bottom face 11*b* of the carrier body 11.

In the case of detaching the bottom plate 15 from the bottom face 11*b* of the carrier body 11, the locking of the locking claws 15*m*, 15*m*, 22 to the locking holes 18*b*, 18*b*, 19*b* is released, while elastically deforming the elastic pieces 15*j*, 15*j*, 15*n*. The bottom plate 15 can be thereby detached from the bottom face 11*b* of the carrier body 11.

Accordingly, it is not necessary to attach the guide member onto the carrier body by using a screw or the like as in the previously described method. Therefore, the number of parts can be reduced, and also the bottom plate 15 can be easily changed.

Next, the operations and effects when mounting the carrier body 11 onto which the bottom plate 15 is attached to the mounting face 2*b* of the device 2 will be explained.

In the case of mounting the carrier body 11 onto the mounting face 2*b* of the device 2, first of all, the leading end of each of the kinematic couplings 2*a* has contact with the bottom plate 15.

For this reason, the leading end of each of the kinematic couplings 2*a* does not directly have contact with the bottom face 11*b* of the carrier body 11; and thus, the lower face of the carrier body 11 is protected by the bottom plate 15 from the leading end of each of the kinematic couplings 2*a*.

If each of the kinematic couplings 2*a* is inserted into each of the guide grooves 15*a*, the leading end of each of the kinematic couplings 2*a* is guided to a position just below a pair of the positioning ribs 16, 16 by the guide face portion 15*h* formed in each of the guide grooves 15*a*.

In this case, as shown in FIG. 19, a pair of the positioning ribs 16, 16 engages with the elongated hole portion 15*g* by an amount of d1 smaller than the depth measurement of the elongated hole portion 15*g*.

A space d is thereby formed between the leading end of the kinematic coupling 2*a* and the leading ends of the positioning ribs 16, 16 opposed to the kinematic coupling 2*a* by the guide face portion 15*h*.

The weight of the carrier body 11 is accordingly supported by the kinematic coupling 2*a* from underneath. However, the positioning ribs 16, 16 are not damaged because the leading end of the kinematic coupling 2*a* does not have contact with the leading end of the positioning ribs 16, 16 of the carrier body 11.

As described above, the deformation or bending of the bottom face 11*b* or the bottom plate 15 is controlled. Since each of the kinematic couplings 2*a* is positioned just below each pair of the positioning ribs 16, 16, the influence of deformation or bending is very low even if the bottom plate 15 is deformed or bent.

Accordingly, the positioning accuracy of the carrier body 11 to the device 2 can be improved. If the bottom plate 15 is deformed, worn away or damaged when mounting the carrier body 11 onto the device 2 or demounting the carrier body 11 from the device 2 by means of a retaining feature 5*b* provided in the bottom plate 15, only the bottom plate 15 needs to be changed without changing the entire carrier body 11. Thus, the costs required for changing the entire carrier body 11 can be reduced, and also an increase in the running costs can be controlled.

Moreover, according to the present embodiment, as illustrated in FIG. 12, if the circumference portion of the boss hole 15*b* has contact with the large and small ribs 17*b*, 17*c* provided in the outer circumference of the boss portion 17, the presence of a gap can be visually confirmed because the bottom portion 17*e* or the horizontal face portion 17*f* has a predetermined height from the bottom face 11*b* as illustrated in FIG. 15.

By contacting the circumference portion of the boss hole 15*b* with the large and small ribs 17*b*, 17*c*, the position of the bottom plate 15 in the inside and outside directions (up and down directions) of the bottom face 11*b* is controlled, so the positioning accuracy of the bottom plate 15 can be further improved.

Furthermore, in the present embodiment, if the bottom plate 15 is placed in a suitable fitting position, the rib portion 15*i* has contact with the upper end 17*g* of the large rib 17*b* as shown in FIG. 12.

Consequently, it can be visually confirmed that the bottom plate 15 is attached onto a suitable position of the bottom face 11*b*, so the working property of attaching the bottom plate 15 onto the carrier body 11 and detaching the bottom plate 15 from the carrier body 11 can be improved by reducing the mounting error.

Further, in the present invention, the elastic pieces 15*j*, 15*j* each having the locking claw 15*m* are integrally formed in the vicinity of the boss holes 15*b*, 15*b* of the right and left arm portions 15*e*, 15*e* each extending in a radial pattern from the central base portion 15*d* of the carrier body 11.

Therefore, when externally fitting the boss holes 15*b*, 15*b* of the right and left arm portions 15*e*, 15*e* to the boss portions 17, 17 of the carrier body 11, the locking claws 15*m*, 15*m* of the elastic pieces 15*j*, 15*j* are locked to the locking holes 18*b*, 18*b* provided in the right and left frame bodies 18, 18.

In addition, when detaching the boss holes 15*b*, 15*b* of the right and left arm portions 15*e*, 15*e* from the boss portions 17, 17 of the carrier body 11, the locking claws 15*m*, 15*m* of the elastic pieces 15*j*, 15*j* are detached from the locking holes 18*b*, 18*b* provided in the frame bodies 18, 18, so as to release the locking.

Therefore, when using the carrier body 11 with the bottom plate 15 attached onto the bottom face 11*b* of the carrier body 11, undesirable separation of the bottom plate 15 from the bottom face 11*b* can be prevented, and also when detaching the bottom plate 15 from the bottom face 11*b* of the carrier body 11, a jig for detaching the bottom plate 15 is not required. Accordingly, the bottom plate 15 can be easily attached onto the bottom face 11*b* of the carrier body 11 and detached from the bottom face 11*b* of the carrier body 11.

Consequently, by changing only the bottom plate 15, a wafer carrier positioning structure capable of using the carrier body 11 for a long period of time can be provided.

Moreover, since the bottom plate 15 having a complex structure can be separately manufactured, the die structure required for molding the carrier body 11 can be simplified by simplifying the shape of the carrier body 11.

Since the material weight of the bottom plate 15 is smaller than that of the carrier body 11, it can be manufactured at low cost.

For this reason, even if the bottom plate is changed by deformation, wear or damage, the running costs can be reduced because the cost required for changing the bottom plate 15 is lower than the cost required for changing the entire case body 11.

Embodiment 2

Figure 20:
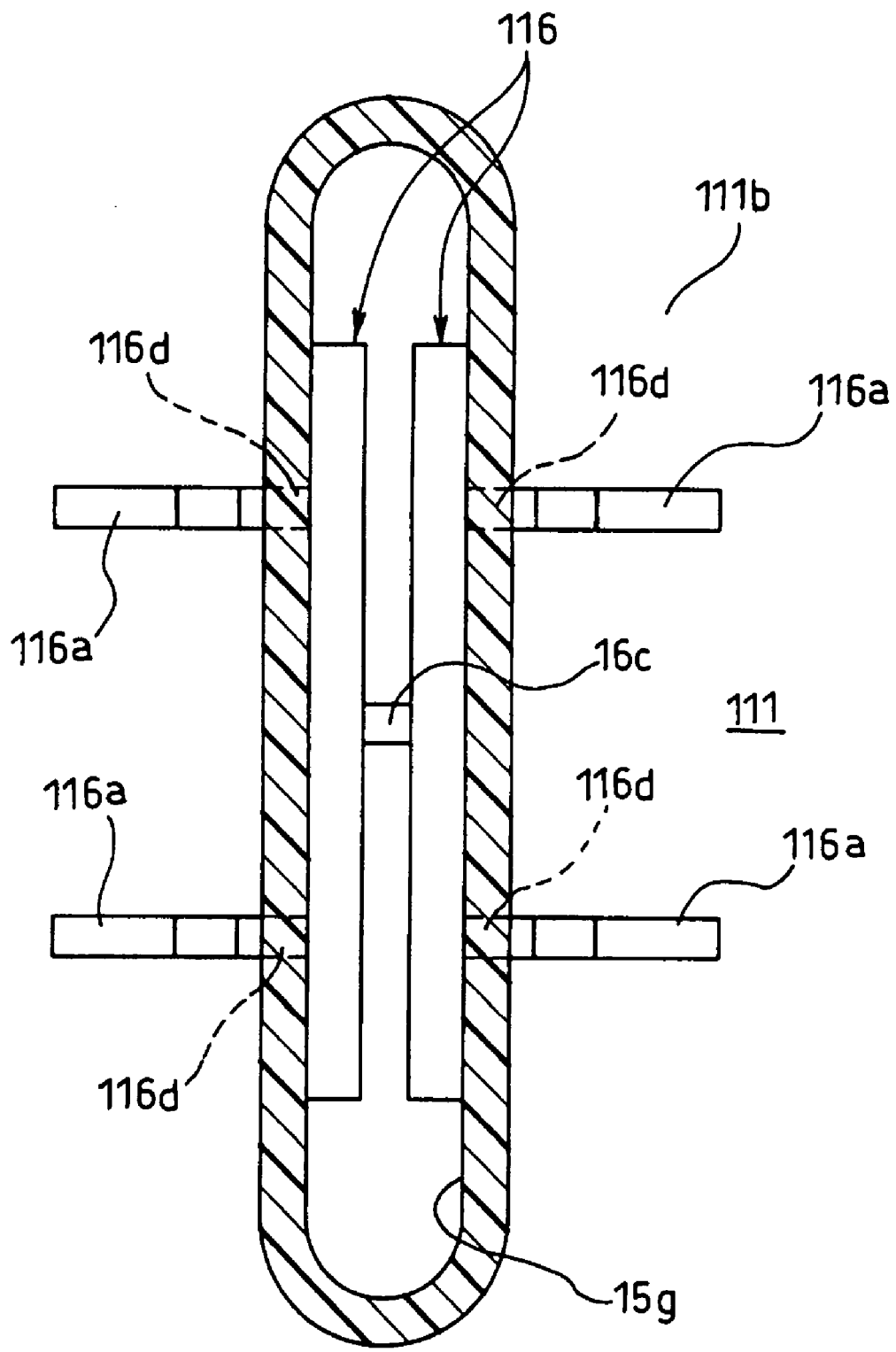
FIG. 20 is a cross-sectional view along F-F line in FIG. 21 showing a state in which a kinematic coupling is guided to the bottom plate attached to the bottom face of the carrier body used for the wafer carrier positioning structure according to an embodiment 2 of the present invention.
Figure 21:
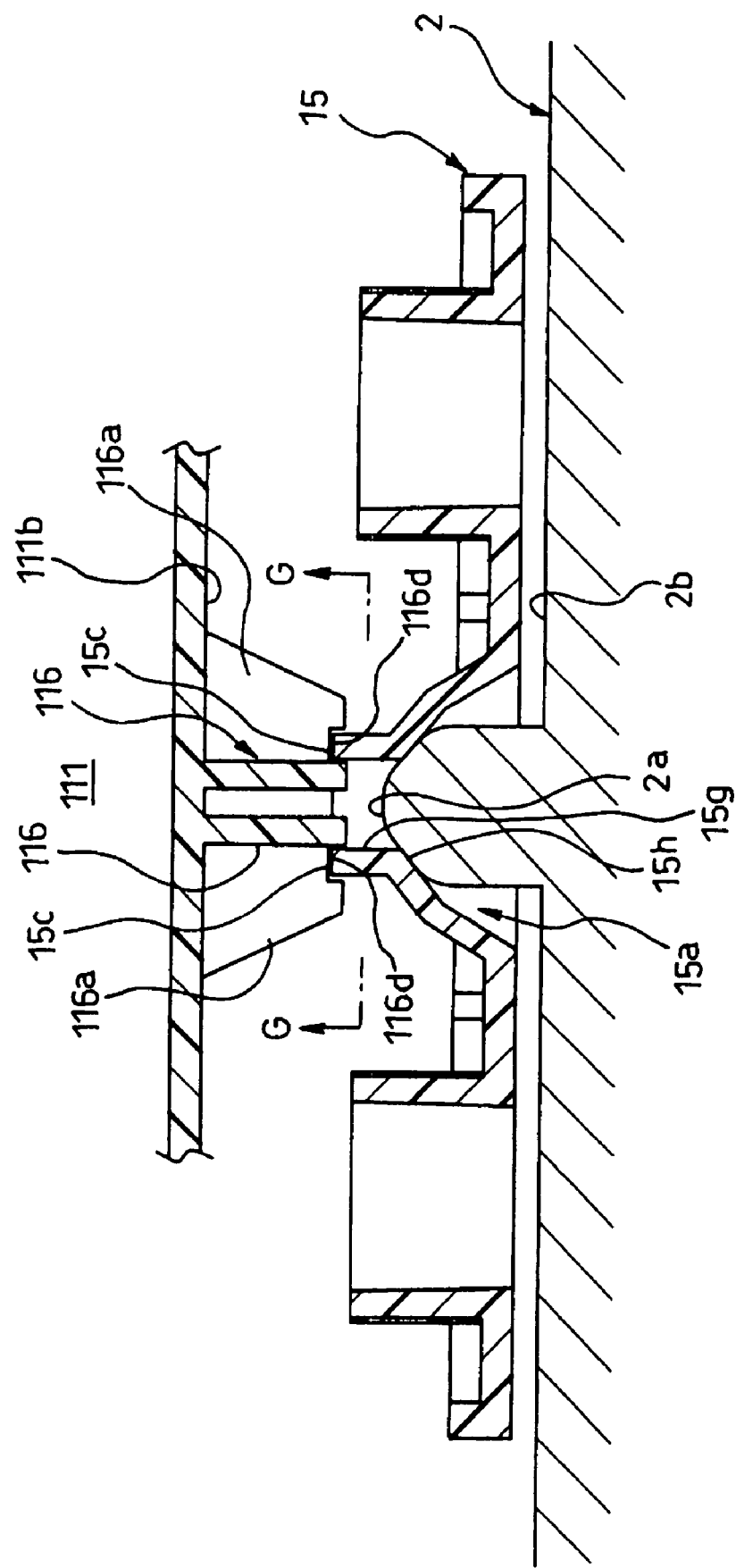
FIG. 21 is a vertical cross-sectional view of a major portion showing a structure in which the bottom plate is attached to the bottom face of the carrier body used for the wafer carrier positioning structure according to the embodiment 2 of the present invention.
Figure 22:
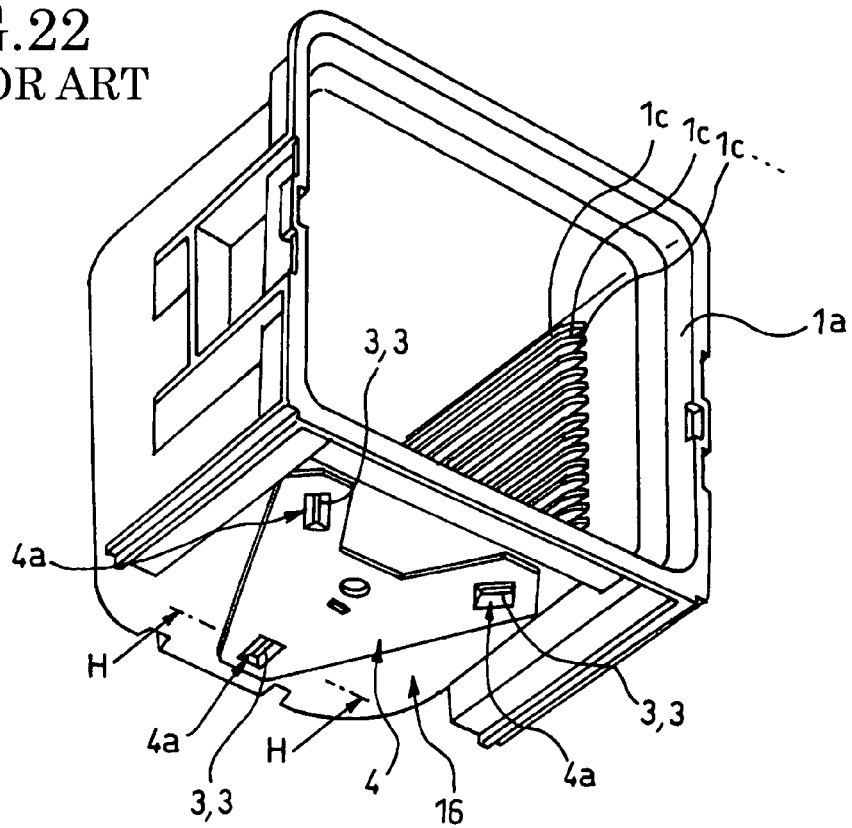
FIG. 22 is a perspective view showing a wafer carrier positioning structure according to one example of the prior art as seen from a lower side of a bottom face of a carrier body.
Figure 23:
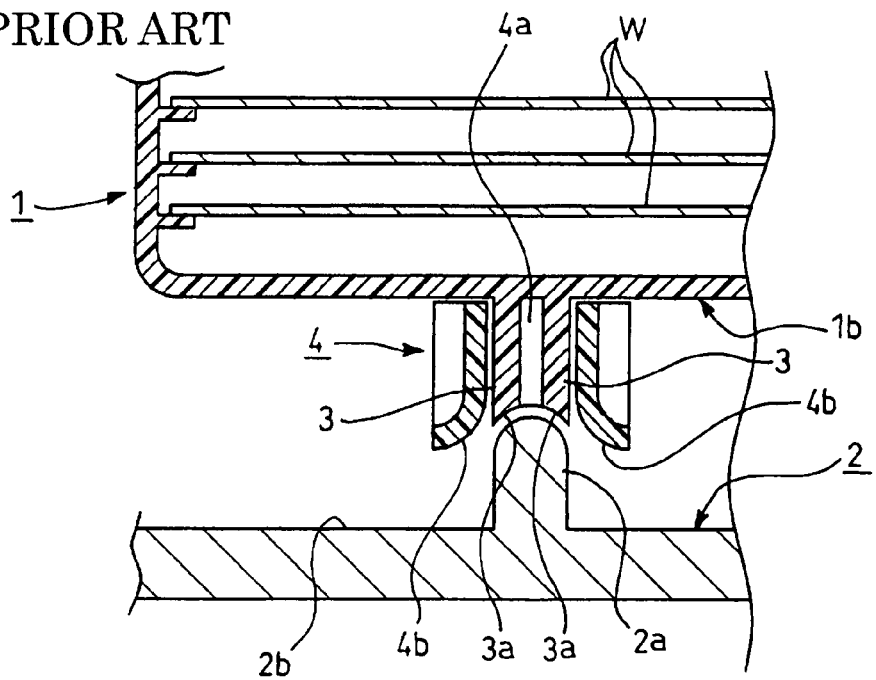
FIG. 23 is a perspective view along H-H line in FIG. 22 showing a wafer carrier positioning structure according to one example of the prior art.
Figure 24:
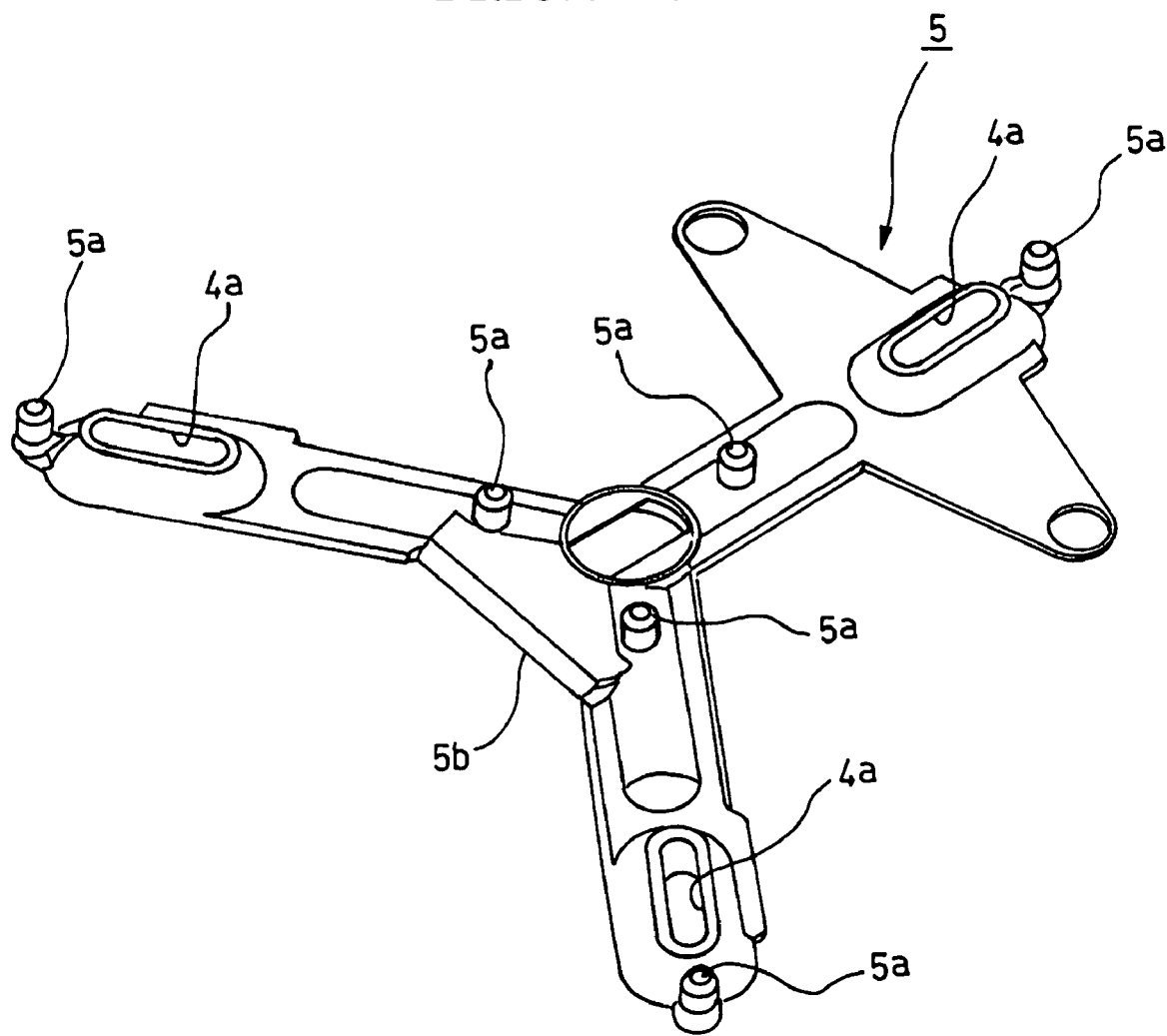
FIG. 24 is a perspective view explaining a structure of a bottom plate used for a wafer carrier positioning structure according to another example of the prior art.

FIGS. 20, 21 show a wafer carrier positioning structure of the embodiment 2 of the present invention.

In addition, the same reference numbers are used for the parts which are identical or similar to the parts in the above-described embodiment 2.

In the wafer carrier positioning structure of embodiment 2, a bottom face 111b of a carrier body 111 includes a pair of positioning ribs 116, 116 as a pair of parallel guide components. The pair of the positioning ribs 116, 116 is provided in the bottom face 111b of the carrier body 111 to be parallel to each other in the radial direction of the semiconductor wafer W housed in the carrier body 111.

As illustrated in FIG. 21, the pair of the positioning ribs 116, 116 includes two pairs of reinforcement ribs 116a, 116a each of which substantially has a trapezoidal shape in side view substantially having a horizontal upper end. Each pair of the reinforcement ribs 116a, 116a is integrally formed in the pair of the positioning ribs 116, 116, so as to extend in the right and left directions of the positioning ribs 116, 116.

The upper end of each of the reinforcement ribs 116a includes a concave groove 116d portion which engages with the circumference portion 15c of the guide groove 15a to control the deformation of the elongated hole portion 15g in the direction in which its diameter increases.

Next, the operations and effects of the wafer carrier positioning structure according to embodiment 2 will be explained.

In the wafer carrier positioning structure according to embodiment 2, in addition to the operations and effects of the above-described embodiment 1, the deformation of the elongated hole portion 15g in the direction in which its diameter increases can be controlled, because each of concave grooves 116d formed on the upper end of each of the reinforcement ribs 116a engages with the circumference portion 15c of the guide groove 15a.

Therefore, if the carrier body 111 has a predetermined weight due to the semiconductor wafers W housed in the carrier body 111 of the wafer carrier, each of the elongated hole portions 15g does not deform in the direction in which its diameter increases. Thus, the positioning accuracy of each of the guide grooves 15a can be improved.

Since other structures, operations and effects are identical or similar to those in the above described embodiment 1, the explanation thereof will be omitted.

The wafer carrier positioning structure according to the embodiments of the present invention has the following effects.

According to one embodiment of the present invention, when attaching the guide member 15 onto the bottom face 11b of the carrier body 11, the locking portions 15m, 15m, 21 provided in the guide member 15 are locked to the inside faces 18a, 18a, 19a of the frame bodies 18, 18, 19 provided in the peripheral part of the bottom face 11b of the carrier body 11, while deforming so as to have contact with the inside faces 18a from the inside.

The guide member 15 is thereby positioned in the bottom face 11b of the carrier body 11, so as to be fastened onto the bottom face 11b.

In addition, when detaching the guide member 15, the guide member 15 can be easily detached from the bottom face 11b of the carrier body 11 by releasing the locking by the locking portions 15m.

Therefore, the working property required for changing the guide member 15 is improved.

Moreover, according to one embodiment of the present invention, when mounting the carrier body 11 to which the guide member 15 is attached onto the device 2, at first, the leading end portion of the positioning pin has 2a has contact with the guide member 15.

For this reason, the lower side of the carrier body 11 is protected by the guide member 15 from the leading end portion of the positioning pin 2a.

The leading end portion of the positioning pin 2a is guided so as to be located just below the parallel guide components 16, 16 engaging with the elongated hole portion 15g by the guide face portion 15h formed in the guide groove 15a.

Moreover, the interval d is formed by the guide face portion 15h between the leading end portion of the positioning pin 2a and the leading ends of the parallel guide components 16, 16.

Accordingly, the weight of the carrier body 11 is supported from underneath by the positioning pin 2a, but the leading end portion of the positioning pin 2a does not have contact with the leading ends of the parallel guide components 16, 16 of the carrier body 11, so the parallel guide components 16, 16 are not damaged.

Thus, the bending or the deformation of the bottom face 11b or the guide member 15 is controlled. Even if the guide member 15 is bent or deformed, the influence of the deformation is very low.

As described above, the positioning accuracy of the carrier body 11 to the device 2 can be improved. If the bottom plate 15 is deformed, worn away or damaged, only the bottom plate 15 needs to be changed without changing the entire carrier body 11. Thus, the costs required for changing the entire carrier body 11 can be reduced, and also an increase in the running costs can be controlled.

Further, according to one embodiment of the present invention, if the circumference portion of the boss hole 15b has contact with the large and small ribs 17b, 17c provided in the outer circumference of the boss portion 17, the presence of a gap can be visually confirmed because the bottom portion 17e or the horizontal face portion 17f has a predetermined height from the bottom face 11b.

Moreover, by contacting the circumference portion of the boss hole 15b with the large and small ribs 17b, 17c, the position of the bottom plate 15 in the inside and outside direction of the bottom face 11b is controlled, so the positioning accuracy of the bottom plate 15 can be further improved.

Furthermore, according to one embodiment of the present invention, the elastic pieces 15j, 15j each having the locking claw 15m are integrally formed in the vicinity of the boss holes 15b, 15b of the right and left arm portions 15e, 15e each extending in a radial pattern from the central base portion 15d of the carrier body 11.

Therefore, when externally fitting the boss holes 15b, 15b of the right and left arm portions 15e, 15e to the boss portions 17, 17 of the carrier body 11, the locking claws 15m, 15m of the elastic pieces 15j, 15j are locked to the locking holes 18b, 18b provided in the right and left frame bodies 18, 18.

In addition, when detaching the boss holes 15b, 15b of the right and left arm portions 15e, 15e from the boss portions 17, 17 of the carrier body 11, the locking claws 15m, 15m of the elastic pieces 15j, 15j are detached from the locking holes 18b, 18b provided in the frame bodies 18, 18, so as to release the locking.

Accordingly, the bottom plate 15 can be easily attached onto the bottom face 11b of the carrier body 11 and also detached from the bottom face 11b of the carrier body 11.

Although the present invention has been described in terms of exemplary embodiments, it is not limited thereto. It should be appreciated that variations may be made in the embodiments described by persons skilled in the art without departing from the scope of the present invention as defined by the following claims. In addition, the number, position, shape, or the like of the components are not limited to the above embodiments, and can be changed to a number, position, shape or the like of components preferable for conducting the present invention. Moreover, no element or component in the present disclosure is intended to be dedicated to the public regardless of whether the element or component is explicitly recited in the following claims.

More particularly, in the above embodiment, the bottom plate 15 is made of a polycarbonate resin, but the material of the bottom plate 15 is not limited thereto. For example, a resin material such as PBT (polybutylene terephthalate) and PEEK (polyether ketone) can be used. A component which improves slidability for facilitating the engagement between the bottom plate 15 and the kinematic couplings 2a can be combined with the above material or the combination of the above materials.

What is claimed is:

1. A wafer carrier positioning structure, comprising:
  a carrier body including a bottom face, a pair of parallel guide components formed on the bottom face, and a reinforcement rib formed on the pair of parallel guide components, the carrier body being configured to house a wafer parallel to the bottom face, the pair of parallel guide components being provided on the bottom face along a radial direction of the housed wafer, and the pair of parallel guide components provided on the bottom face to project from the reinforcement rib in a direction away from the bottom face;
  a guide member detachably attached to the bottom face of the carrier body; and
  a guide groove provided in the guide member, the guide groove engages a positioning pin projecting from a mounting face when the carrier body is mounted to the mounting face, such that the guide groove guides the carrier body to a regular mounting position,
  wherein the guide groove includes:
    an elongated hole portion for engaging the pair of parallel guide components, the elongated hole portion having a circumferential end portion, which is in contact with the reinforcement rib when the elongated hole portion is engaged with the pair of parallel guide components; and
    a guide face portion provided underneath the elongated hole portion to engage the positioning pin, such that the guide face portion is arranged between the elongated hole portion and the positioning pin when the guide face portion is engaged with the positioning pin, the guide face portion controlling a distance between the positioning pin and the carrier body by forming a space between a leading end portion of the positioning pin and leading end portions of the pair of parallel guide components projecting in the direction away from the bottom face,
  wherein a projection distance of the pair of parallel guide components beyond the reinforcement rib is smaller than a distance between (a) a leading end portion of the positioning pin engaged with the guide face portion, and (b) the circumferential end portion of the elongated hole portion.

2. The wafer carrier positioning structure according to claim 1, further comprising:
  a boss portion provided on the bottom face of the carrier body; and
  a boss hole provided in the guide member for externally detachably fitting to the boss portion,
  wherein the boss portion includes an outer circumference including a rib portion having a predetermined height from the bottom face of the carrier body, the rib portion being in contact with an outer circumference of the boss hole when the boss hole is detachably fitted to the boss portion.

3. The wafer carrier positioning structure according to claim 2,
  wherein the guide member includes a plurality of arm portions each extending substantially from a center of the guide member in a radial pattern in the radial direction of the housed wafer, each arm portion of the plurality of arm portions including an elastic piece having a locking claw, as the locking portion, formed in a vicinity of the boss hole, and
  wherein the frame body includes a locking hole for locking to the locking claw.

* * * * *